(12) United States Patent
Jacques et al.

(10) Patent No.: US 10,396,669 B2
(45) Date of Patent: Aug. 27, 2019

(54) POWER CONVERTER MEASURING THE AVERAGE RECTIFIED PRIMARY CURRENT

(71) Applicant: Russell Jacques, Hertfordshire (GB)

(72) Inventors: Russell Jacques, Hertfordshire (GB); Nicolaas Van Der Duijn Schouten, Hong Kong (CN); David Coulson, Cambridgeshire (GB)

(73) Assignee: Russell Jacques, Hertfordshire (GB)

( * ) Notice: Subject to any disclaimer, the term of this patent is extended or adjusted under 35 U.S.C. 154(b) by 0 days.

(21) Appl. No.: 15/471,738

(22) Filed: Mar. 28, 2017

(65) Prior Publication Data
US 2017/0201180 A1   Jul. 13, 2017

Related U.S. Application Data

(63) Continuation of application No. 13/637,636, filed as application No. PCT/GB2011/050604 on Mar. 24, 2011, now Pat. No. 9,647,567.

(30) Foreign Application Priority Data

Mar. 26, 2010  (GB) ................................. 1005123.3

(51) Int. Cl.
*H02M 3/335*  (2006.01)
*H01F 38/20*  (2006.01)
(Continued)

(52) U.S. Cl.
CPC ........ *H02M 3/33507* (2013.01); *H01F 38/20* (2013.01); *H02M 1/083* (2013.01);
(Continued)

(58) Field of Classification Search
CPC ............. H02M 3/335; H02M 3/33507; H02M 3/33523
See application file for complete search history.

(56) References Cited

U.S. PATENT DOCUMENTS

| | | | |
|---|---|---|---|
| 4,587,604 A * | 5/1986 | Nerone | H02M 3/3376 307/82 |
| 4,648,017 A | 3/1987 | Nerone | |

(Continued)

FOREIGN PATENT DOCUMENTS

| | | |
|---|---|---|
| CN | 101572499 A | 11/2009 |
| CN | 101577494 A | 11/2009 |

(Continued)

OTHER PUBLICATIONS

Extended European Search Report dated Apr. 1, 2016 in European patent application No. 151920832.2, 8 pages.

*Primary Examiner* — Harry R Behm
(74) *Attorney, Agent, or Firm* — Blueshift IP, LLC; Robert Plotkin

(57) ABSTRACT

A power converter controller and methods for its operation are provided that can control a self-oscillating power converter that uses a Bipolar Junction Transistor (BJT) as a switch by manipulating the current flowing in a control winding. The controller is able to determine the optimum time to remove a short circuit applied to the control winding, as well as being able to determine the optimum time to pass current through the control winding. The controller can further draw power from the power converter using the control winding. The controller is capable of maintaining the midpoint voltage of the power converter in the case that the converter has more than one switch. The controller estimates the output power of the converter without requiring a connection to the secondary side of the converter transformer. The controller further controls entry and exit into a low-power mode in which converter oscillations are suppressed.

6 Claims, 26 Drawing Sheets

(51) Int. Cl.
  *H02M 3/338*      (2006.01)
  *H02M 3/337*      (2006.01)
  *H02M 1/08*       (2006.01)
  *H03K 17/13*      (2006.01)
  *H02M 7/5383*     (2007.01)
  *H02M 1/00*       (2006.01)

(52) U.S. Cl.
  CPC .......... *H02M 3/337* (2013.01); *H02M 3/338* (2013.01); *H02M 3/3385* (2013.01); *H03K 17/13* (2013.01); *H02M 7/5383* (2013.01); *H02M 2001/0009* (2013.01); *H03K 17/133* (2013.01)

(56) References Cited

U.S. PATENT DOCUMENTS

| | | | |
|---|---|---|---|
| 4,660,137 A | | 4/1987 | Hotaka |
| 5,457,620 A | * | 10/1995 | Dromgoole ............ G01R 31/40 363/20 |
| 5,986,895 A | | 11/1999 | Stewart |
| 5,999,433 A | | 12/1999 | Hua |
| 6,295,214 B1 | | 9/2001 | Matsumoto |
| 9,647,567 B2 | | 5/2017 | Jacques et al. |
| 2003/0080723 A1 | * | 5/2003 | Chen .................... G01R 19/003 324/76.29 |
| 2006/0017424 A1 | * | 1/2006 | Wood .................... H02M 3/156 323/274 |
| 2006/0132062 A1 | * | 6/2006 | Maru ................. H02M 3/33592 315/291 |
| 2008/0024094 A1 | | 1/2008 | Nishihara |
| 2009/0219000 A1 | | 9/2009 | Yang |
| 2011/0103112 A1 | * | 5/2011 | Jiang ................. H02M 3/33507 363/125 |

FOREIGN PATENT DOCUMENTS

| | | | | |
|---|---|---|---|---|
| GB | 2378000 A | * | 1/2003 | ........ H02M 3/33507 |
| JP | 2001078447 A | | 3/2001 | |
| WO | 2004098035 A1 | | 11/2004 | |

* cited by examiner

POWER CONVERTER MEASURING THE AVERAGE RECTIFIED PRIMARY CURRENT

This invention relates to Switched-Mode Power Converters (SMPC), including Switched Mode Power Supplies (SMPS), Inverters and Lighting Ballasts. In particular, it relates to apparatus and methods for controlling the switching of the Power Converter. The invention is particularly suitable for use with a control circuit for controlling a self-oscillating power converter having Bipolar Junction Transistors (BJTs) as switches, as described in GB 2,457,085, the contents of which are incorporated herein by reference.

Power Supply Units (PSUs) and lighting ballasts which are designed for high efficiency, cost-sensitive consumer applications are often Switched-Mode types and are frequently based upon the half-bridge or full-bridge topology. These topologies are particularly suitable for higher power, high efficiency applications in which the ratio of input to output voltage is relatively confined. The continuing pressure to increase switching efficiency and reduce manufacturing costs forces the need for innovative methods in design of switched-mode power supply controllers.

Some SMPC using BJTs are self-oscillating; that is, once one of the BJTs acting as the power switches has been switched on, the SMPC will automatically switch at a resonant frequency without further control. Such a Self-Oscillating Converter (SOC) will typically be implemented using three windings around a common core—two windings in opposite directions coupled to the bases of the BJTs, and one in the path of current flowing to the load, also known as the load winding. These windings make up the base drive transformer that provides the current necessary to drive the BJTs. FIG. 2 illustrates such a SOC, with windings T1b and T1c being coupled to the bases of the BJTs, and T1d being in the path of current flowing to the load. The SOC illustrated in FIG. 2 provides AC power to the transformer T2. This achieves Galvanic isolation between the SOC which is coupled to the primary winding and the load which is driven by the secondary winding rectified and smoothed by D5, D6 and C3. Accordingly, the current flowing to the load is used to drive the oscillations of the BJTs. GB 2,457,085 describes how such a basic SOC may be controlled by variously applying current to and short circuiting a fourth, control winding around the same core, resulting in a Controlled SOC (CSOC). FIG. 3 shows a potential arrangement of a controller suitable for implementation as an Integrated Circuit, coupled to a control winding T1a which may be wound around the same core as the other windings and so magnetically coupled to them.

Although Field Effect Transistors (FETs) are often used in SMPC because of their excellent switching performance, adoption of bipolar junction transistors (BJTs) as the main primary switching elements allows for significant cost reduction (compared to MOSFET devices) but innovative methods are required to achieve the same levels of performance. The characteristics of the switching devices used in switched-mode power converters have a large influence on the achievable efficiency of the overall system. Because BJTs have inherently slower switching characteristics, it is essential that care is taken in application circuit design to ensure that the switching transitions are optimised.

With reference to FIG. 1, the turn-off sequence for an NPN type transistor is illustrated, where $V_{CE}$ is the Collector-Emitter Voltage, $V_{BE}$ is the Base-Emitter Voltage and $I_B$ is the current applied to the base. In the initial state, current is flowing into the base (as shown by $I_B$) and $V_{CE}$ is zero as the transistor is switched fully on. The turn-off sequence comprises several stages:
1) On period
2) Storage period
3) Linear period
4) Collector rise period
5) Off period In order to "switch off" a conducting BJT, a low impedance short or clamp may be applied across the base-emitter junction of the BJT to be turned off. If the applied impedance is low enough, the current flowing into the BJT collector is entirely removed via the base terminal, so that the emitter current is nil. The capacitance of a p-n junction is strongly dependent upon the base-emitter junction voltage, being small when reverse-biased and large when forward-biased, with a continuous but non-linear transition between these endpoints.

During the storage period, charge is removed from the base, depleting the base-collector and base-emitter junctions, but the transistor remains in the saturated (on) state. The current coming into the collector flows out of the base and emitter terminals, according to the equation:

$$I_c = I_B + I_E$$

If the base charge is removed with a constant current sink, the rate of change of the base-emitter voltage gives a direct indication of the total base capacitance (base-emitter plus base-collector junctions), according to the capacitor equation:

$$\frac{dV_{BE}}{dt} = \frac{I_{BE}}{C_{BE}}$$

Because the transistor collector-emitter voltage has not yet started to rise, the losses in the storage period are relatively small and insignificant.

During the linear period, the transistor continues conducting current through the collector terminal, but because the base-emitter voltage has dropped significantly, the base-emitter junction is unable to sustain the full collector current. Therefore, the collector voltage starts to rise. There is significant simultaneous voltage and current appearing across the collector-base and collector-emitter pins, giving rise to switching power losses.

During the collector rise period, power losses are minimised if the emitter current is reduced to zero, which may be achieved by ensuring that the base turn-off current is not less than the collector current.

In the self-oscillating half-bridge and full-bridge power converter topologies, commutation of the switches occurs naturally. However, to achieve regulation, the controller maintains the frequency according to the perceived power demand, which is preferably higher than the natural oscillation frequency. With reference to FIG. 3, this is achieved by forcing each commutation to occur earlier than would otherwise happen, by shorting out the base-emitter junction of both transistors via a control winding T1a on the base drive transformer. By shorting out the control winding, the base drive windings T1b and T1c coupled to each BJT are clamped. This clamping of the base-emitter junction brings the voltage across it to approximately zero. This has the effect of removing charge from the base-emitter junction of whichever transistor is on, forcing that device to turn off as described above, after the storage, linear and collector rise periods have elapsed.

It is then desirable to allow the other transistor to turn on, by removing the clamp previously applied to the control winding of the base drive transformer. Optimally, the other transistor should be turned on after the collector rise time (when the voltage across that transistor is approximately zero) but before the primary current (the current in the SOC-side winding of T2) has reversed. One method for achieving this (which is generally used in other power converter topologies) is to sense the transformer voltage, either directly from the switched (load) winding T1$d$ or via a separate sense winding. Such methods work well, but are more costly, requiring additional discrete components, which are unsuitable for integration. One low-cost method has been disclosed which incorporates a simple fixed timer, so that the clamp is applied to the base drive transformer for a pre-determined time. In this method, the clamp time is chosen to provide optimal switching efficiency across the majority of instantiations, but the method is unable to adjust the time to accommodate influential variables such as temperature, manufacturing tolerances, line and load conditions, etc.

One of the inherent problems of a self-oscillating converter is that the oscillations require a stimulus to get started. One open-loop method is commonly implemented, wherein a pulse is generated periodically to stimulate the power converter into oscillation. Such circuits require additional components, increasing the cost of the overall assembly, such as the common arrangement shown in FIG. 2. Current is supplied via R1 to charge up the startup capacitor C7, until the voltage across diac X1 reaches the diac trigger voltage. At this point the diac conducts, connecting the positively-charged startup capacitor C7 to the base of Q2. When the charge has been transferred from C7 to the base of Q2, the diac X1 stops conducting and returns to a high impedance state, allowing the startup process to begin again. Note that the startup process is open-loop, i.e. it issues starting pulses regardless of whether the power supply is actually oscillating or not. In this way, the continuing start pulses cause momentary but repetitive disturbances to the power converter operation. Such behaviour can be prevented by adding additional components, of course, but these increase the unit cost.

Generally, the control circuit of a switched-mode power converter consumes a small but significant proportion of the overall power being converted. Most SMPC applications use an auxiliary winding on the main transformer, together with rectification and regulation components to generate the low voltage supply required for the control circuit. Some other SMPC applications avoid the need for the auxiliary winding by using a charge pump directly from the primary winding, but this incurs a penalty on efficiency. Still other SMPC applications use resistive dropper networks to power the control circuit directly from the high-voltage bulk supply rail, which requires still fewer components but is very inefficient.

Under light load and no-load conditions, the efficiency of the SMPC can be improved by operating in a burst mode, whereby power conversion cycles are issued in discrete bursts, instead of a continuous stream. Such techniques have been in common usage for SMPC applications for some time. However, in SMPC topologies with capacitive series elements, such as half-bridge, full-bridge and cuk converters, there exists the potential for unstable operation which must be avoided.

When running subresonantly (i.e. at frequencies below the natural series-resonant frequency of the power converter), there exists the danger of the converter becoming unstable or stopping oscillation completely. As mentioned earlier, the primary current is made up of a load current (reflected from the secondary winding of the transformer) and a magnetising current (which magnetises the power transformer core). When running subresonantly, the load current leads the primary voltage. If the magnetising current is comparatively small, it is possible for the zero-crossings of the total current waveform to precede the commutations of the voltage waveform. This is generally referred to as capacitive switching. In a conventionally driven power converter, capacitive switching causes excessive power dissipation in the switching devices and is therefore avoided. In a CSOC, capacitive switching can cause excessive power dissipation, unstable operation and even complete cessation of oscillation.

FIG. 2 shows a SOC having resonant bridge that includes a capacitive series element C4 in the primary circuit. The presence of a capacitive element means that the voltage of the mid-point MID is strongly dependent upon the charge balance coming through the bridge switching elements (Q1 and Q2). Any residual charge imbalance would accumulate on capacitor C2, causing the voltage of the mid-point to wander away from the optimum voltage (which is the mean of HT+ and HT−). If the mid-point voltage error is excessive, the power converter can become locked in a mode where power is reduced and delivered to the load on only one phase, with very poor conversion efficiency. It may be shown that small differences in the switching times of Q1 and Q2 can be ignored, as there is a tendency for the system to correct itself over a period of many cycles. However, in resonant systems, where the series capacitive element C4 is relatively small, the effect of charge imbalance is accelerated, so that the self-correcting tendency is less likely to prevent such a lock-up occurring. A number of schemes already exist to apply correction for transformer flux imbalance, which include methods for injecting a current to maintain the transformer midpoint terminal at the correct voltage, requiring additional components to be realised.

Over-current protection in SMPC topologies with capacitive series elements, such as half-bridge, full bridge and cuk converters, is commonly implemented by detecting the peak-peak value of current in the primary winding and comparing this against a predetermined threshold. While these methods are adequate for providing protection against short-circuit conditions, they are comparatively inaccurate and unsuitable for implementing power supplies with closely defined output current characteristics, such as constant current battery charger applications, etc.

Low power consumption under no-load conditions has become highly desirable, reflecting the drive towards consumer goods which are more environmentally-friendly by consuming less electrical power. To achieve the required level of performance the power converter can be put into a low-power mode when running under no-load conditions, in which power conversion is suppressed. Under no-load conditions, a power converter may occasionally exit the low power mode and issue a short burst of conversion cycles in order to maintain the output voltage. Accordingly, the converter may enter and exit the low-power mode repeatedly under no-load conditions. It is important that the transition from low-power burst mode to normal run mode is reliable with a load threshold which is largely independent of input mains variations, provided these are within the "normal" range. It is also desirable that this feature does not add to the manufacturing cost of the product, therefore a load-sensing circuit on the secondary side (of transformer T2) is undesirable. The normal method for determining the mode transition is to compare the overall loop control parameter against a fixed threshold. However, in a converter using Pulse Frequency Modulation (PFM) as the means of regulating the delivered output power (such as a resonant bridge converter) the resulting switching frequency is strongly dependent upon input voltage and the applied load.

For example, in a typical offline series-parallel resonant power converter similar to that shown in FIG. 3, the relationship between the applied mains voltage and the switching frequency is typically as shown in FIG. 24, for various load conditions. As can be seen, the frequency (which is the primary control parameter for the control loop) varies greatly with small changes in the supply voltage. It is therefore impractical to attempt to use the switching frequency for detecting a no-load condition when operating from an unregulated supply.

According to a first aspect of the invention, there is provided a method for controlling a power converter, the power converter having a BJT as a switch, the base of the BJT being connected to a drive winding, said drive winding being magnetically coupled to a load winding which carries the power converter load current, whereby control over the power converter is achieved by controlling a control winding magnetically coupled to said drive winding, the method comprising: selectively providing a short-circuit across the control winding; monitoring the load winding current; and removing the short-circuit when the load winding current drops below a first threshold value.

Such a method allows the removal of the clamp to be timed so as to minimise switching losses.

Preferably, the short-circuit is applied in the first place when the load winding current drops below a second threshold value.

The load winding current may be monitored in a number of ways. The voltage across a resistive element in series with the load winding may be used to provide a reference for the load current. This can be provided to the controller as a separate input which may also be used for monitoring other functions of the converter.

Alternatively, the load winding current can be monitored by reference to the current in the control winding. The control winding is coupled to the load winding and so the current in the control winding can provide an indication of the load winding current.

By monitoring the load winding current, it can be determined if the current in the power converter primary circuit is approaching zero. The above method may then be used to force commutation to occur (unless the commutation has already taken place).

Preferably, the first threshold value is determined based on the turns ratio between the control winding and the drive winding.

Preferably, the method further comprises: connecting the control winding to a power source, after removing the short-circuit, for inducing a current in the drive winding to remove charge from the base of the BJT. By such a modification the BJT may be switched off more quickly to further minimise switching losses, again without requiring additional equipment.

Preferably, the method further comprises: disconnecting the power source from the control winding when the current in the drive winding drops below a third threshold value.

Advantageously, the first threshold value in the case that the control winding is connected to a power source is based on the instantaneous collector current of the BJT.

Preferably, the second threshold is substantially zero.

According to a second aspect of the invention, there is provided a controller for a power converter, the power converter having a BJT as a switch, the base of the BJT being connected to a drive winding, said drive winding being magnetically coupled to a load winding which carries the power converter load current, the controller comprising: first and second control winding connections for connection to a control winding magnetically coupled to the load and drive windings; a first switch coupled between the first and second control winding connections; a current monitoring element for monitoring the current in the load winding; and a switch controller for selectively closing said first switch to provide a short circuit across the first and second control winding connections, further adapted to open the switch when the current monitoring element determines that the current in the load winding has fallen below a first threshold.

Preferably, the switch controller selectively closes the first switch when the current in the load winding drops below a second threshold value.

The current monitoring element can monitor the current in the load winding by reference to the voltage across a resistive element in series with the load winding.

The current monitoring element may additionally or alternatively monitor the current in the load winding by reference to the voltage across the first and second control winding connections.

Preferably, the controller further comprises: a second switch coupled between the first control winding connection and a power source; wherein the switch controller is adapted to close the second switch after the first switch is opened, for inducing a current in the drive winding to remove charge from the base of the BJT.

Preferably, the second switch is opened to disconnect the power source from the control winding when the current in the drive winding drops below a third threshold value.

Advantageously, the first threshold value in the case that the control winding is connected to a power source is based on the instantaneous collector current of the BJT.

Preferably, the second threshold is substantially zero.

There may also be provided a method for controlling a power converter, the power converter having a BJT as a switch, the base of the BJT being connected to a drive winding, said drive winding being magnetically coupled to a load winding which carries the power converter load current, whereby control over the power converter is achieved by selectively providing a short-circuit across a control winding magnetically coupled to said drive winding, the method comprising: detecting the polarity of the current in the load winding; and connecting the control winding to a power source for providing current to the base of the BJT to switch it on, when the current in the load winding has a first polarity, and there is no short-circuit across the control winding.

By use of such a method, a drive pulse may be administered to the BJT at the most beneficial time, to avoid disturbances to the switching caused by pulses administered when it would weaken the turn on of the BJT.

Advantageously, the polarity of the current in the load winding is determined by measuring the voltage across a resistance in series with the load winding.

Alternatively, the polarity of the current in the load winding is determined by measuring the current through the control winding when the short circuit is in place.

There may also be provided a controller for a power converter, the power converter having a BJT as a switch, the base of the BJT being connected to a drive winding, said drive winding being magnetically coupled to a load winding which carries the power converter load current, the controller comprising: first and second control winding connections for connection to a control winding magnetically coupled to the load and drive windings; first and second current sensing resistor connections for connection to a current sensing resistor in series with the load winding; a first switch coupled between the first and second control winding connections; a second switch coupled between the first control winding connection and a power source; a voltage monitor coupled to the first and second current sensing resistor connections for monitoring the polarity of the voltage across the first and second current sensing resistor connections and hence the polarity of the current in the current sensing resistor; and a switch controller for selectively closing the first switch to provide a short circuit across the first and second control winding connections, adapted to selectively close the second switch to couple the first control winding connection to the power source when the first switch is open and the current in the current sensing resistor is of a first polarity.

There may further be provided a controller for a power converter, the power converter having a BJT as a switch, the base of the BJT being connected to a drive winding, said drive winding being magnetically coupled to a load winding which carries the power converter load current, the controller comprising: first and second control winding connections for connection to a control winding magnetically coupled to the load and drive windings; a first switch coupled between the first and second control winding connections; a second switch coupled between the first control winding connection and a power source; a current monitor coupled to the first and second control winding connections for monitoring the polarity of the current through the control winding; and a switch controller for selectively closing the first switch to provide a short circuit across the first and second control winding connections, adapted to selectively open the first switch and close the second switch to couple the first control winding connection to the power source when the current through the control winding is of a first polarity.

There may also be provided a method for monitoring the switching of a power converter, the power converter having a BJT as a switch, the base of the BJT being connected to a drive winding, said drive winding being magnetically coupled to a load winding which carries the power converter load current, comprising: providing a control winding magnetically coupled to said drive winding; monitoring the voltage across the control winding; and determining if the voltage across the control winding remains below a threshold for a predetermined period of time.

Such a method of monitoring the switching of a converter allows a controller to determine that the oscillations of the converter are no longer sufficient using the same winding that is used to exert control over the converter.

Preferably, the predetermined period of time is a predetermined number of switching cycles of the power converter. This is desirable as the converter may operate at different frequencies depending on a wide number of variables, and the voltage variations occur according to the switching frequency.

Preferably, the method further comprises selectively connecting the control winding to a power source for providing current to the base of the BJT to switch it on, when the voltage across the control winding fails to exceed the threshold for the predetermined period of time.

Preferably, the method further comprises: selectively providing a short-circuit across the control winding; detecting the polarity of the current in the load winding; and selectively connecting the control winding to a power source for providing current to the base of the BJT for switching it on, when the current in the load winding is of a first polarity and there is no short-circuit across the control winding. Accordingly, when it is determined that the converter is no longer oscillating sufficiently, drive pulses to the BJT may be delivered at the optimum time.

Additionally, there may be provided a controller for a power converter, the power converter having a BJT as a switch, the base of the BJT being connected to a drive winding, said drive winding being magnetically coupled to a load winding which carries the power converter load current, the controller comprising: first and second control winding connections for connection to a control winding magnetically coupled to the load and drive windings; a first voltage monitor coupled to the first and second control winding connections for monitoring the voltage across the first and second control winding connections; and a detector arranged to determine if the monitored voltage across the first and second control winding connections remains below a threshold for a predetermined period of time.

According to a further aspect of the invention there is provided a method for drawing power from a power converter, the power converter having a BJT as a switch, the base of the BJT being connected to a drive winding, said drive winding being magnetically coupled to a load winding which carries the power converter load current, whereby control over the power converter is achieved by controlling a control winding, having first and second ends, magnetically coupled to said drive winding, the method comprising: coupling the first end of the control winding to a first power supply rail; monitoring the voltage on the control winding; coupling the second end of the control winding to a second power supply rail when the voltage on the control winding exceeds a threshold value, to allow power to be drawn from the control winding to the power supply rails.

Accordingly a controller may draw power from the converter at high efficiency, using the same winding as is used for control of the converter.

Preferably the method further comprises disconnecting the second end of the control winding from second power supply rail when the voltage across the power supply rails exceeds a second threshold value. This enables the power supply rails to have a controlled voltage.

Preferably, the first and second power supply rails have an energy store coupled between them for absorbing power drawn from the control winding. This energy store is preferably a capacitor.

The present invention may further provide a controller for a power converter, the power converter having a BJT as a switch, the base of the BJT being connected to a drive winding, said drive winding being magnetically coupled to a load winding which carries the power converter load current, the controller comprising: first and second control winding connections for connection to a control winding magnetically coupled to the load and drive windings; first and second energy store connections for connection to an energy store; a first switch coupled between the first control winding connection and said first energy store connection; a second switch coupled between the second control winding connection and the second energy store connection; a voltage monitor coupled to the first and second control winding connections and arranged to determine when the voltage across the first and second control winding connections exceeds a threshold; and a switch controller arranged to selectively close the first and second switch; wherein the switch controller is arranged to close the first and second switch when the voltage monitor determines that the voltage across the first and second control winding connections exceeds said threshold.

According to a further aspect of the invention, there is provided a method for controlling a power converter, the power converter having two BJTs as switches in a half bridge arrangement, the bases of the BJTs being connected to respective drive windings, said drive windings being magnetically coupled to a load winding which is coupled to the midpoint of the switches and carries the power converter load current, whereby control over the power converter is achieved by controlling a control winding magnetically coupled to said drive windings, the method comprising: selectively providing a plurality of bursts of alternating drive pulses to the control winding to drive the switching of the BJTs, each burst having a first pulse and a last pulse; wherein the phase of at least one of the first or the last pulse of each burst is controlled according to at least one of the following: the phase of the first pulse of each burst is opposite to the phase of the last pulse of the preceding burst; the phase of the first pulse of each burst is opposite to the phase of the first pulse of the preceding burst; and the phase of the last pulse of each burst is opposite to the phase of the last pulse of the preceding burst.

The above arrangement provide a range of ways in which the phasing of the first and last pulses can be controlled so as to try to ensure that the output supply voltage is maintained as close as possible to the optimum value. The different regimes can be used individually or they may be used in combination, for example by controlling the first pulse to be opposite to the first pulse of the preceding burst whilst also ensuring the final pulse of each burst is opposite to the final pulse of the preceding burst. The method would normally only use one regime or combination at a time but it will be appreciated that the regimes may be modified during use.

In other words, the phase of the first pulse of each burst can be arranged to be opposite to the phase of the last pulse of the preceding burst. In an alternative situation, the phase of the first pulse of each burst can be arranged to be opposite to the phase of the first pulse of the preceding burst. Furthermore, in a further arrangement, the phase of the last pulse of each burst may be controlled so as to be opposite to the phase of the last pulse of the preceding burst.

The above method helps to keep the midpoint voltage of the half bridge at a suitable value to avoid stalling the converter.

In a further aspect of the invention, a controller for a power converter may be provided, the power converter having two BJTs as switches in a half bridge arrangement, the bases of the BJTs being connected to respective drive windings, said drive windings being magnetically coupled to a load winding which is coupled to the midpoint of the switches and carries the power converter load current, the controller comprising: first and second control winding connections for connection to a control winding magnetically coupled to the load and drive windings; a first switch coupled between the first control winding connection and a power source; a second switch coupled between the second control winding connection and said power source; and a switch controller for selectively closing the first and second switches to provide a plurality of bursts of alternating drive pulses to the control winding connections, each burst having a first pulse and a last pulse, wherein the first and second switches are controlled so that at least one of the first or the last pulse of each burst is controlled according to at least one of the following: the phase of the first pulse of each burst is opposite to the phase of the last pulse of the preceding burst; the phase of the first pulse of each burst is opposite to the phase of the first pulse of the preceding burst; and the phase of the last pulse of each burst is opposite to the phase of the last pulse of the preceding burst.

As mentioned above, the different regimes may be used individually or in suitable combinations to control the voltage of the converter.

There may also be provided a controller for a power converter, the power converter having two BJTs as switches in a half bridge arrangement, the bases of the BJTs being connected to respective drive windings, said drive windings being magnetically coupled to a load winding which is coupled to the midpoint of the switches and carries the power converter load current, the controller comprising: first and second control winding connections for connection to a control winding magnetically coupled to the load and drive windings; a first switch coupled between the first control winding connection and a power source; a second switch coupled between the second control winding connection and said power source; and a switch controller for selectively closing the first and second switches to provide a plurality of bursts of alternating drive pulses to the control winding connections, wherein the drive pulse at the end of each burst is provided by closing the switch that did not provide the drive pulse at the end of the previous burst.

Preferably, each burst begins by closing the switch that did not begin the previous burst.

A further aspect of the invention provides a method of controlling a power converter having a transformer, the transformer having a primary input winding and a secondary output winding, the method comprising: measuring the average alternating current through a resistor coupled in series with the primary input winding; comparing the average current to a reference level; and controlling the switching of the power converter based on the difference between the average current and the reference level.

Accordingly, the average current can be determined very accurately, and hence good control of the converter achieved, as the average alternating current is determined with reference to a resistor, which normally has a well defined value which does not vary significantly with operating conditions.

Preferably, said measuring step includes: measuring the full-wave rectified voltage across said resistor; and averaging said rectified voltage with a filter.

Preferably, the comparing step includes integrating the difference between the average alternating current and a reference level; and the difference based on which the power converter is controlled is the integrated difference between the average current and said reference level.

According to another aspect of the invention, there is provided a controller for a switched power converter having a transformer and a switch, the transformer having a primary input winding and a secondary output winding, comprising: first and second current sensing resistor connections for connection to a current sensing resistor coupled in series with the primary input winding; a measurer for determining the alternating current flowing through said current sensing resistor; a comparator for comparing the determined current to a reference level; wherein the controller controls the switching of the switch based on the output of the comparator.

Preferably, the measurer comprises: a rectifier coupled to the first and second current sensing resistor connections for rectifying the voltage across said current sensing resistor induced by the switched current flowing through it; and a low pass filter for filtering the rectified voltage.

According to a further aspect of the invention, there is provided a method of controlling a power converter, the power converter having a BJT as a switch, the base of the BJT being connected to a drive winding, said drive winding being magnetically coupled to a load winding which carries the power converter load current, whereby control over the power converter is achieved by controlling a control winding, having first and second ends, magnetically coupled to said drive winding, the method comprising: monitoring the current flowing in the load winding by measuring the voltage across a resistance in series with the load winding; and entering a low power mode when the current flowing in the load winding falls beneath a threshold wherein during said low power mode a short circuit is applied across the control winding for inhibiting operation of the power converter.

Optionally, the low power mode is entered when the real portion of the current flowing in the load winding falls beneath said threshold.

Alternatively, the low power mode is entered when the average rectified current flowing in the load winding falls beneath said threshold.

In the case that the average rectified current is used to determine when to enter the low power mode, the threshold is preferably a function of the switching frequency of the power converter.

Preferably, the method further comprises: recording a second threshold value based on the switching frequency of the power converter on entering the low power mode; monitoring the demanded switching frequency of the power converter; and exiting the low power mode when the demanded switching frequency falls below the threshold value.

The invention may also provide a controller for a power converter, the power converter having a BJT as a switch, the base of the BJT being connected to a drive winding, said drive winding being magnetically coupled to a load winding which carries the power converter load current, the controller comprising: first and second control winding connections for connection to a control winding magnetically coupled to the load and drive windings; a first switch coupled between the first control winding connection and second control winding connection; first and second current sensing resistor connections for connection to a current sensing resistor in series with the load winding; a monitor coupled to the first and second current sensing resistor connections for monitoring the voltage across the current sensing resistor, adapted to determine when the current in the load winding falls beneath a threshold; further comprising a switch controller adapted to enter a low power mode when the monitor determines that the current in the load winding has fallen beneath the threshold, wherein when in said low power mode, the switch controller closes the first a switch to apply a short circuit between the first and second control winding connections for suppressing power conversion in the power converter.

Optionally, the monitor is adapted to determine when the real portion of the current flowing in the load winding falls beneath the threshold.

Alternatively, the monitor is adapted to determine the average rectified current in the load winding falls beneath the threshold.

In the latter case, the threshold is preferably a function of the switching frequency of the power converter.

Preferably, the switch controller produces a control signal for controlling the switching frequency of the power converter; wherein the switch controller records a second threshold value based on the value of the control signal on entering the low power mode; further wherein the switch controller ends the low power mode when the control signal drops below the second threshold value.

The invention will now be described, by way of example, with reference to the drawings in which.

The present embodiments relate to a controller and methods of operation for use with a SMPC having a half-bridge topology. The skilled man will realise that it may also be used with other SMPC or CSOCs. The principles disclosed herein are presented in terms of NPN-type primary bipolar switching transistors, but these are equally applicable to PNP-type primary switches, providing that the current directions are reversed, as would be obvious to a person skilled in the art.

Figure 3:
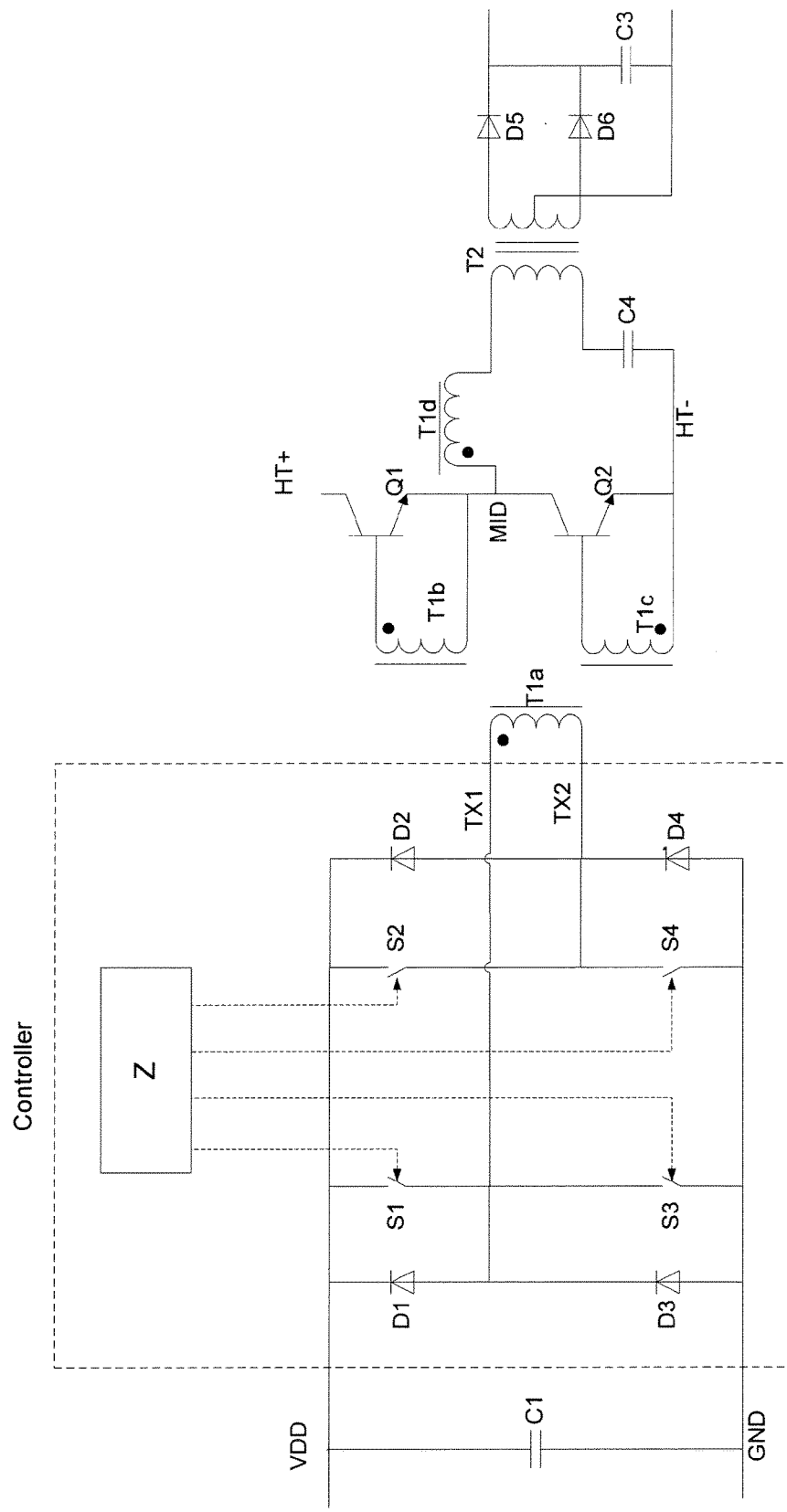
FIG. 3 is a schematic of a half-bridge CSOC with a controller coupled to it via a control winding.
Figure 4:
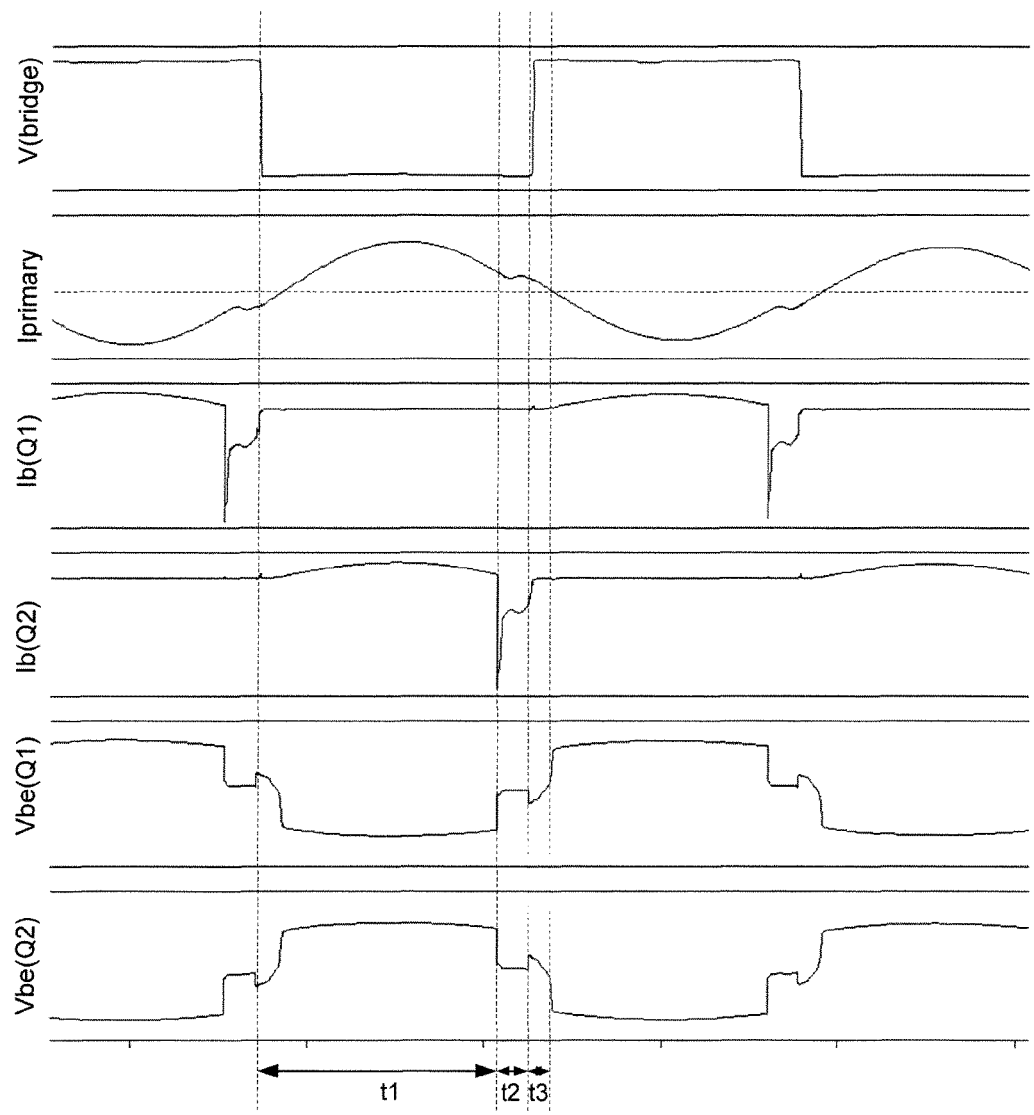
FIG. 4 is a graph of the waveforms of the bridge voltage, primary current, base currents and base-emitter voltages of Q1, Q2 for the CSOC of FIG. 3 with optimal clamp timing.

FIG. 4 is a graph showing the plots of various characteristics of the CSOC shown in FIG. 3 against time, over several oscillations. Illustrated are the voltage at the midpoint of the two BJTs (V(bridge)); the current in the primary winding (Iprimary); the current moving into the bases of BJTs Q1 and Q2 (Ib(Q1) and Ib(Q2)); and the base-emitter voltage of Q1 and Q2 (Vbe(Q1) Vbe(Q2)). FIG. 4 shows the sequence of events in a preferred switching pattern (commutation) as follows:

t1—Q1 is turned on, current flowing into Q1 base and collector and out of Q1 emitter;

t2—the clamp is applied to the control transformer winding T1a, removing charge from Q1 base in order to switch off Q1;

t3—Q1 finally switches off, indicated by the Q1 collector-emitter voltage increasing (shown by V(bridge)) and current through the control transformer winding T1b falling substantially to zero. Simultaneously, the clamp is removed, Q2 is turned on "in reverse", current flowing into Q2 base and out of Q2 collector.

If the clamp is removed too early (i.e. before the bridge transistors have commutated) the BJT commutation time will be extended, potentially reducing the switching efficiency and the switching frequency. However, if the clamp is removed too late (after the current has reversed) the BJT will turn on after the collector voltage has started to rise, thus losing the efficiency and EMI benefits of zero voltage switching. There is a short period of time between the BJT commutation and the current reversal when it is best to remove the clamp from the base-control transformer winding. Note that this time period may be very short when the power converter is running at a frequency close to the natural resonance of the power converter circuit.

Figure 5:
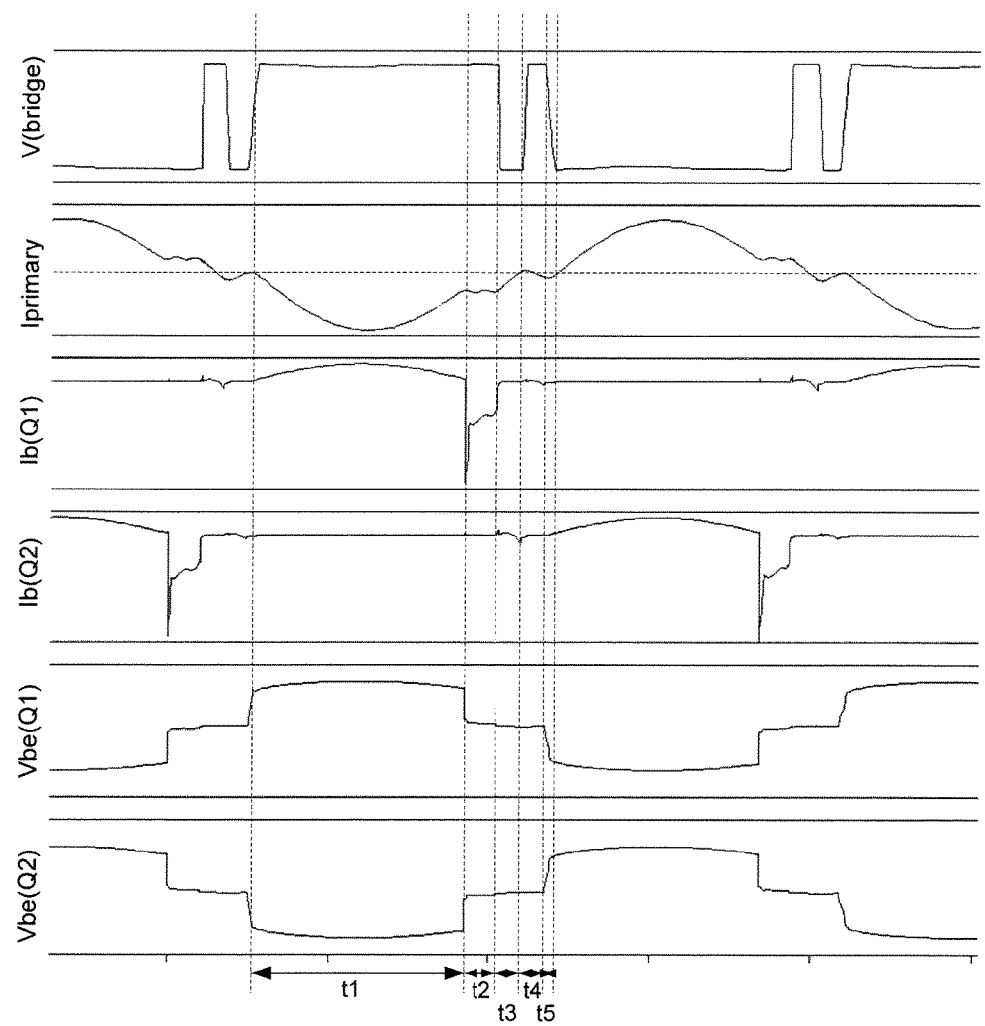
FIG. 5 is a graph of the waveforms with sub-optimal clamp timing.

Referring now to FIG. 5, the switching pattern (commutation) is shown for the condition when the clamp is removed too late:

t1—Q1 is turned on, current flowing into Q1 base and collector and out of Q1 emitter.

t2—the clamp is applied to control transformer winding T1a, removing charge from Q1 base in order to switch off Q1.

t3—Q1 is finally switched off, the reducing primary current flows into Q2 base and out of Q2 collector, so that Q2 is operating "in reverse". The clamp continues to be applied to control transformer winding.

t4—the primary current crosses through zero, but as Q1 and Q2 are both switched off, the primary current charges the residual capacitance on the junction of Q1, Q2, forcing the bridge voltage to rise.

t5—the clamp is removed, allowing Q2 to switch on, causing the bridge voltage to fall substantially to zero, with consequent switching power loss due to the non-zero voltage switching method.

In the extreme condition, removing the clamp very late will prevent the power converter from oscillating at all.

Figure 1:
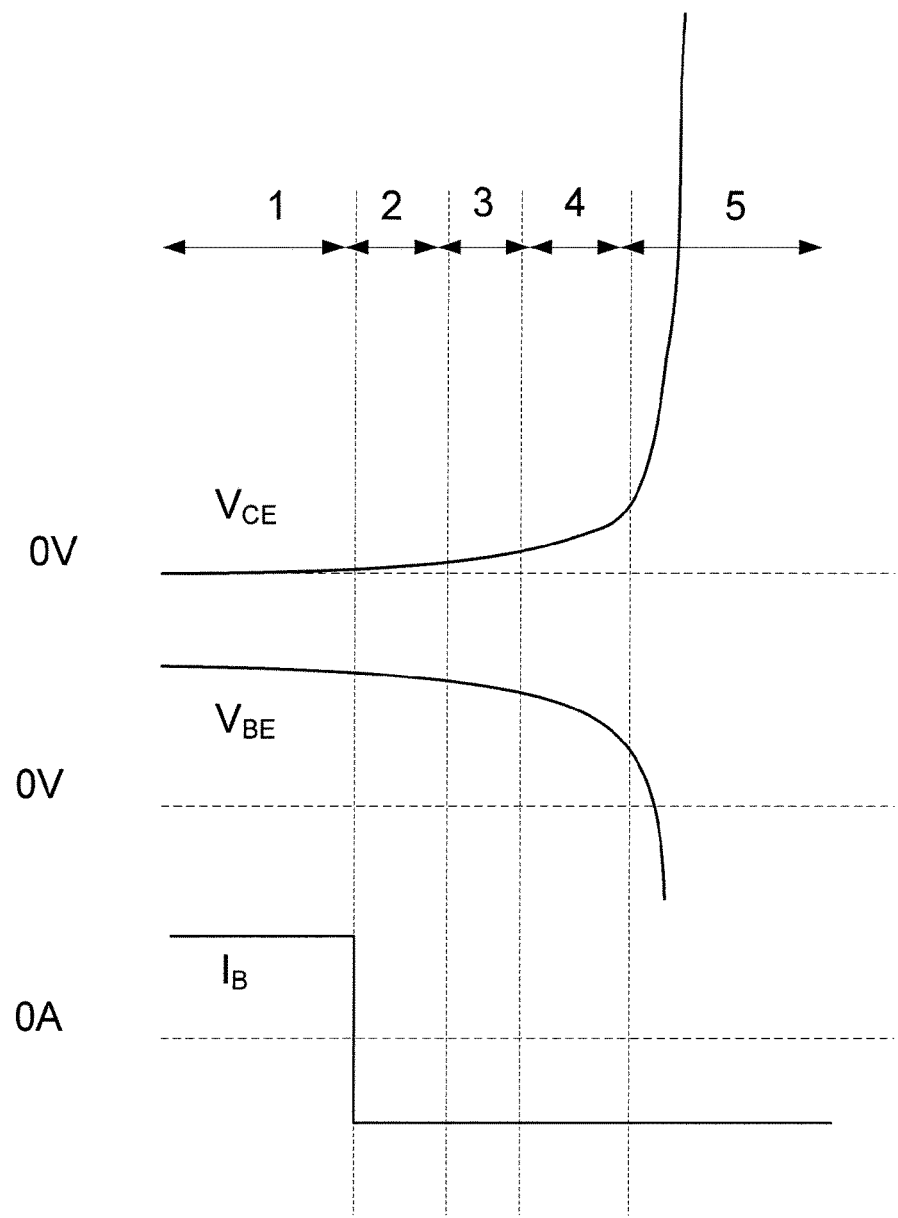
FIG. 1 is a graph of the base-emitter voltage, collector-emitter voltage and base current waveforms during a typical turn-off transition for a BJT.

A method is now described for detecting the end of the linear period, operating while the turn-off clamp is applied, which can be used by the controller without any additional discrete components. During the turn-off process, the clamp is connected, directly or via a transformer, to the base-emitter junction to remove the charge stored in the base-emitter junction. The discharge current flows through the clamp, developing a small voltage which is sensed by the controller. The base-emitter voltage of the BJT is shown in FIG. 1, together with the collector-emitter voltage and base current. It can be seen that the base-emitter voltage drops sharply to zero at the end of the linear region, when the charge has been substantially removed from the transistor base-emitter region. As described above, it is possible to optimise the timing for lowest switching losses by removing the clamp when the current flowing out of the base drops substantially to zero, causing the transistor base-emitter voltage to drop substantially to zero at the end of the linear region.

Figure 6:
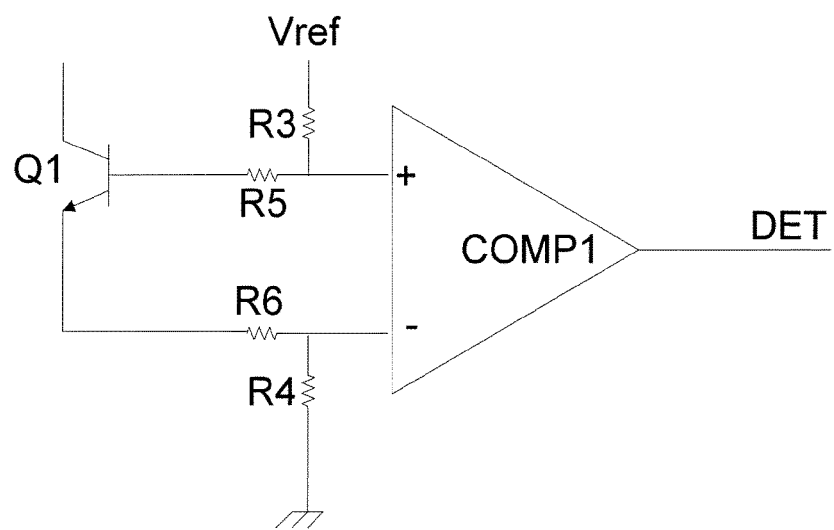
FIG. 6 is a representative circuit for detecting the end of the linear period of the turn-off process by comparing the base-emitter junction voltage against a predefined threshold.
Figure 7:
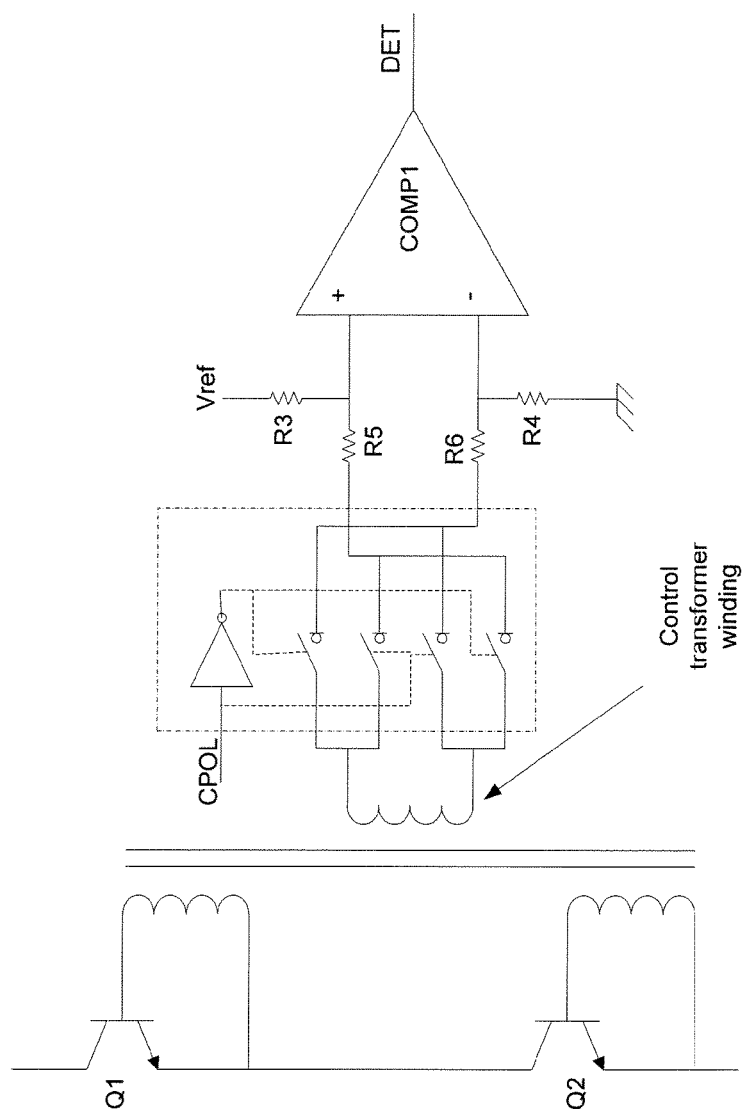
FIG. 7 is similar to FIG. 6 but shows modification to permit the circuit to operate in a transformer-coupled half-bridge application.

A circuit suitable for detecting the end of the linear region is shown in FIG. 6. The base-emitter voltage of the BJT Q1 is sensed with a comparator COMP1 via resistors R5, R6. A threshold detection voltage is set by voltage reference Vref and resistors R3, R4. The threshold voltage may be chosen to be any voltage between the normal on-state base-emitter voltage and zero, which depends upon the resistance of the applied clamp and the characteristics of the BJT. In a typical application, the threshold may be in the order of 40 mV. The method is relatively tolerant of variations in the threshold voltage, due to such things as temperature, manufacturing tolerances, timing delays (comparator and subsequent circuits). For the circuit of FIG. 3, in which the base-emitter current is sensed via the control transformer winding, the circuit may be elaborated to sense the base-emitter of each BJT in turn, using a switched arrangement as shown in FIG. 7. Here, a signal "CPOL" representing the polarity of the primary current is provided from a control circuit. CPOL controls four switches, presenting the control transformer winding to the comparator either normally or inverted depending upon the CPOL control signal. In this case, the voltage threshold depends upon the transformer turns ratio.

This method of detecting the end of the linear period, and using this detection to optimise the switching on and off of the bipolar switches is applicable to most, if not all, switched power converter topologies.

Figure 8:
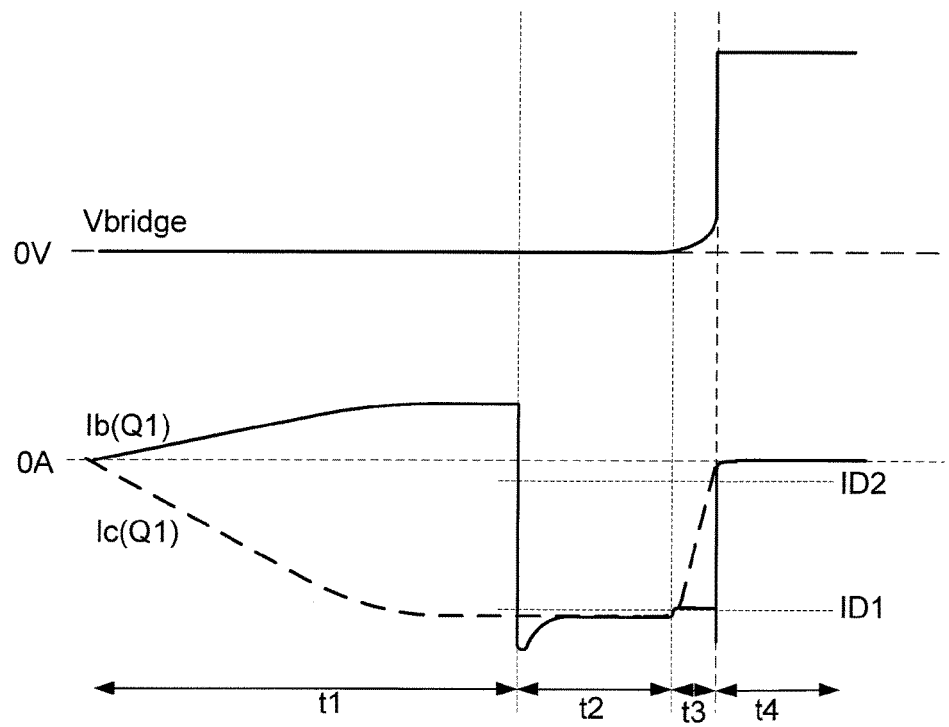
FIG. 8 is a graph of the waveforms of the bridge voltage, base current and collector current for Q1 with an additional current sink stage inserted to accelerate turn-off.

The clamping process described above may be augmented by active removal of the base-emitter junction charge. Comparing FIG. 4 (described above) with FIG. 8, there is now an additional stage involved in turning off the BJT, leading up to commutation. This figure also illustrates the collector current of Q1 as $I_c(Q1)$. The stages for turning off Q1 are now as follows:

t1—Q1 is turned on, current flowing into Q1 base and collector and out of Q1 emitter;

t2—the clamp is applied to the control transformer winding, removing charge from Q1 base in order to switch off Q1;

t3—when the current through the clamp has dropped (the amplitude of the negative current is reduced) to a first detection level ID1, the clamp is removed and a current source is connected to the control transformer, thereby actively continuing the removal of charge from Q1 base;

t4—Q1 finally switches off, indicated by the Q1 collector-emitter voltage increasing and Q1 base-emitter current (the current through the clamp) falling to a second detection level ID2. Simultaneously, the current source is removed, Q2 is turned on in reverse, current flowing into Q2 base and out of Q2 collector.

The value of the first detection level ID1 is preferably chosen to be responsive to and substantially less than the desired peak value of Q1 collector current, so that t3 is aligned with the beginning of the linear period. In a simple embodiment, the detection level ID1 may be a predetermined value. Alternatively, the value of ID1 may be chosen to be responsive to a control variable within the controller, such as VCTRL, which has a strong relationship to the desired peak value of collector current. Alternatively again, the value of ID1 may be responsive to the value or values of peak collector current in the preceding cycles, from which the desired peak value of the collector current in the present switching cycle may be determined. The value of the second detection level ID2 is preferably chosen to be substantially zero, indicating the end of the linear period. Compared to the previously described method, the current extracted from the base during the linear period is higher, leading to a shorter linear period and therefore lower switching losses.

Referring now to FIG. 3, the controller may be used to stimulate the CSOC into oscillation after a period of inactivity, such as at first startup, or when running in burst mode (described hereinafter). The CSOC may be started by passing a number of drive pulses through the control winding T1a issued from the controller that force the BJT's to turn on alternately for a few cycles until the CSOC begins to self-oscillate. These start pulses use charge taken from the housekeeping supply "VDD" to turn on the BJTs Q1 and Q2. If the starting pulses are not synchronised to the current waveform zero crossing points, it is possible for some or all of this charge to be wasted.

Figure 9:
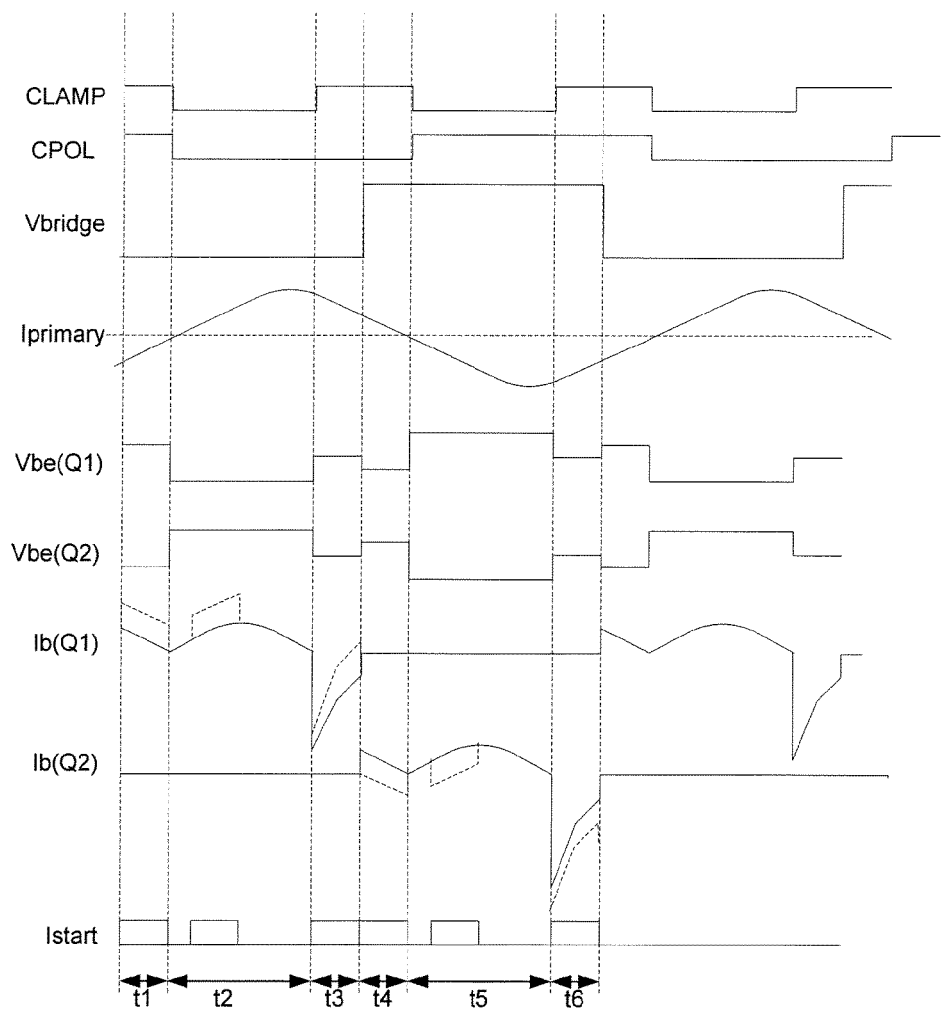
FIG. 9 is a graph of the waveforms of bridge voltage, primary winding current, base-emitter voltages and base currents for a CSOC, indicating the effects of issuing start pulses at different times during the switching cycle.

FIG. 9 is a graph showing the plots of various characteristics of the CSOC shown in FIG. 3 against time, and the effect of introducing a starting pulse at different times during the cycle. Illustrated are the voltage at the midpoint of the two BJTs (V(bridge)); the current in the primary winding ((primary); the current moving into the bases of BJTs Q1 and Q2 (Ib(Q1) and Ib(Q2)); and the base-emitter voltage of Q1 and Q2 (Vbe(Q1) and Vbe(Q2)). Istart represents a starting pulse added to the cycle at a number of potential points in the cycle, and the dotted lines on Ib(Q1) and Ib(Q2) represent the effect such a starting pulse would have on those currents respectively.

When starting, the current in the main transformer "Iprimary" may have some residual oscillations due to previous switching activity. In this example, a number of possible times are considered for issuing a start pulse which is intended to turn on Q1. (By inversion, the equivalent possibilities for turning on Q2 may also be deduced.)

t1—the start pulse is issued when current Iprimary is flowing in the reverse direction. The start pulse current is added to the current flowing into Q1 base and out of Q1 collector, thereby accumulating charge in the rectified DC rail "HT+";

t2—the start pulse is issued when current Iprimary is flowing in the correct direction. The start pulse current is added to the proportional base current of Q1, strengthening the turn-on;

t3—the start pulse is subtracted from the clamping turn-off current, weakening and slightly extending the turn-off of Q1;

t4—the start pulse is issued when current Iprimary is flowing in the reverse direction. The start pulse current is subtracted from the current flowing into Q2 base and out of Q2 collector, thereby accumulating slightly less charge in the rectified DC rail "HT−";

t5—the start pulse is subtracted from the proportional base current of Q2, weakening the turn-on and possibly forcing an undesirable commutation;

t6—the start pulse is added to the clamping turn-off current, strengthening and slightly shortening the turn-off of Q2.

Therefore, the optimum moment for issuing the start pulse for turning on Q1 is during the period t2, and preferably in the beginning of this period, when current Iprimary is flowing in the correct direction and the clamp is not applied to the control transformer winding.

Figure 10:
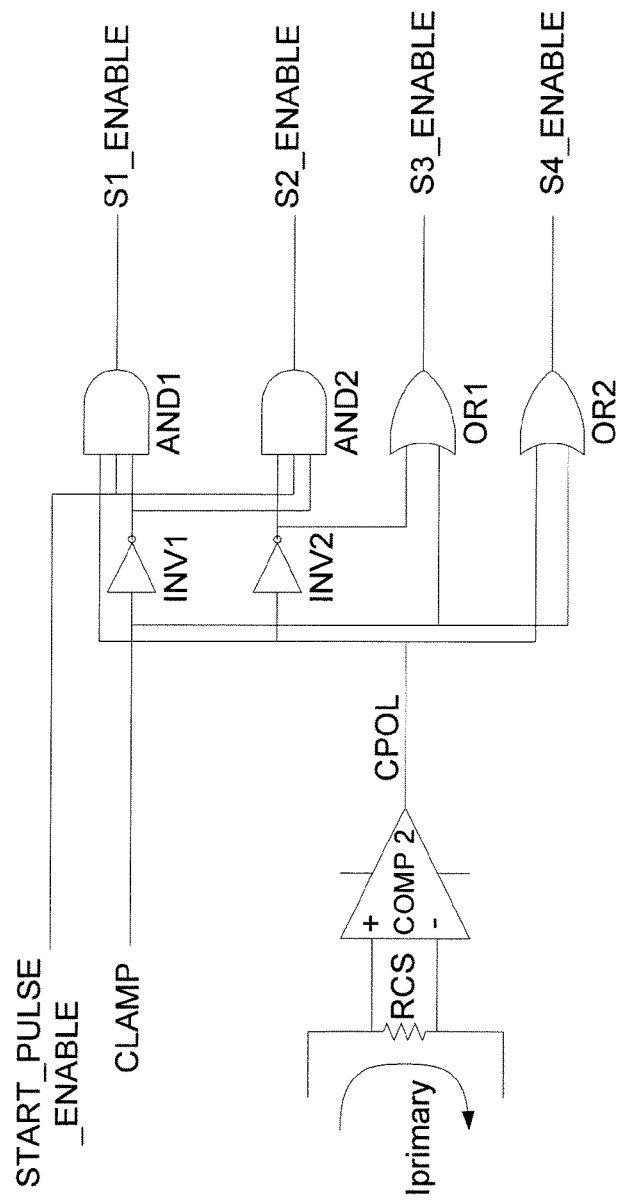
FIG. 10 is a partial schematic of a circuit which senses the direction of the primary current and the status of the clamp applied to the control transformer winding to produce switch control signals for switches S1, S2, S3 and S4 of FIG. 3.
Figure 28:
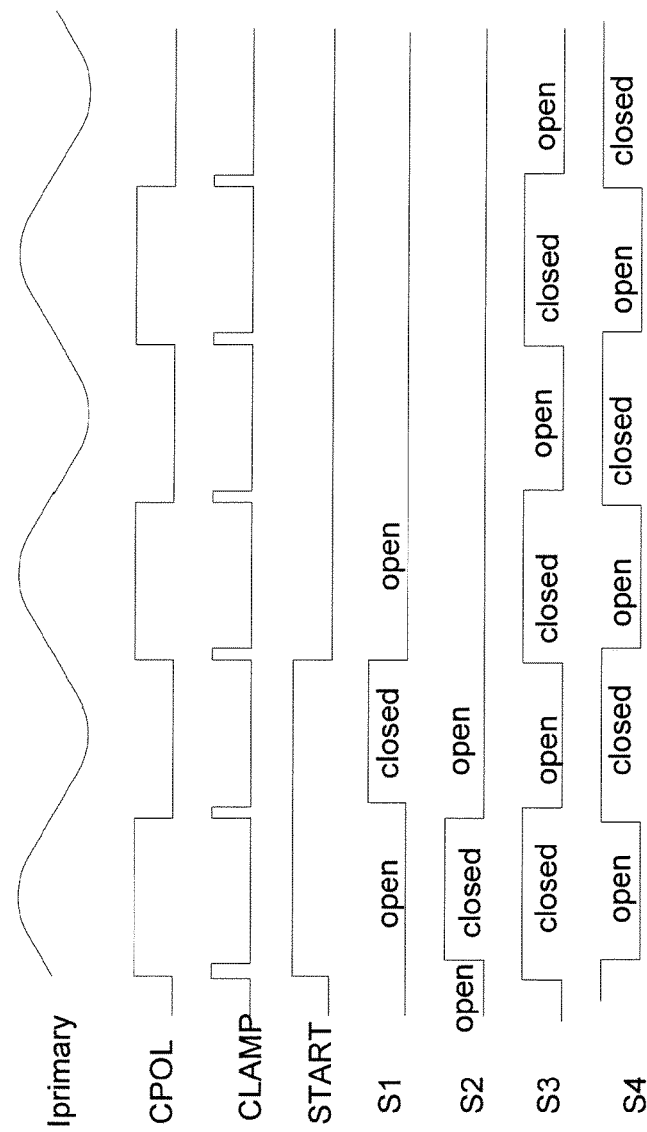
FIG. 28 is a graph of the switching waveforms for sending start pulses.

One possible embodiment for realising the turn-on synchronisation is given in FIG. 10. The circuit includes a resistor RCS, which is placed in the path of the switched current and in series with the primary winding. This resistor is preferably placed in series between capacitance C4 and the rail HT−. The comparator COMP2 senses the primary current through resistor RCS, producing a signal CPOL that indicates the polarity of the primary current. The CLAMP input (active high) drives the enabling (closing) of switches S3 and S4 via OR gates OR1 and OR2 in order to apply the clamp to the control transformer winding. The START_PULSE_ENABLE input is active high for the period that start pulses are required, preferably for the duration of the first two switching cycles of a sequence. The outputs of the two AND gates AND1 and AND2 enable the switches S1 and S2 (referring to the switches in FIG. 3) for passing current through the control winding from VDD as a drive or start pulse to drive oscillations of Q1 and Q2. FIG. 28 gives an example of how the circuit may work in practice, where START_PULSE_ENABLE is represented by START and the actual switching of switches S1 to S4 is illustrated, rather than the signals output by the circuit of FIG. 10.

Alternatively, it may be possible to determine the polarity of the primary current and hence determine CPOL in another way. In particular, while the clamp is applied, current may flow through the control winding in response to current flowing through the load winding, as they are magnetically coupled (wound around the same core). As such, the polarity of the current may be determined whilst the clamp is in place. When the current is determined to be of the correct polarity the clamp may then be removed so that a drive pulse may be provided to the control winding.

In order to monitor the oscillations of the power converter, a method has been conceived which allows the oscillations of the power converter to be monitored by sensing the voltage waveforms on the control transformer winding T1a. Referring to FIG. 3, switches S1 and S2 are closed to produce the start pulses (which initiate oscillation) and, if the CSOC is oscillating normally, may thereafter remain open-circuit. Frequency control is maintained by periodically closing and opening the switches S3, S4 as described earlier. During each power conversion cycle, the voltage excursions of each end of the control transformer winding are compared to a predefined threshold, by a comparator or equivalent. If the voltage excursions fail to exceed the threshold in any cycle, a signal is generated which indicates to the controller that oscillations have stopped. The controller is thus enabled to take diagnostic action (e.g. to flag a fault condition to an external system) or remedial action (e.g. to restart the oscillations by issuing drive pulses as described above). Advantageously, some analog or digital filtering may be used to minimise the possibility of false alarms being generated.

To meet the conflicting needs for high efficiency and low cost in power converters, a method has been devised for maintaining the supply rail for the control circuit directly from the control transformer. This method is particularly applicable to self-oscillating power converters, such as, for example, the half-bridge power converter circuit shown in FIG. 3.

Figure 11:
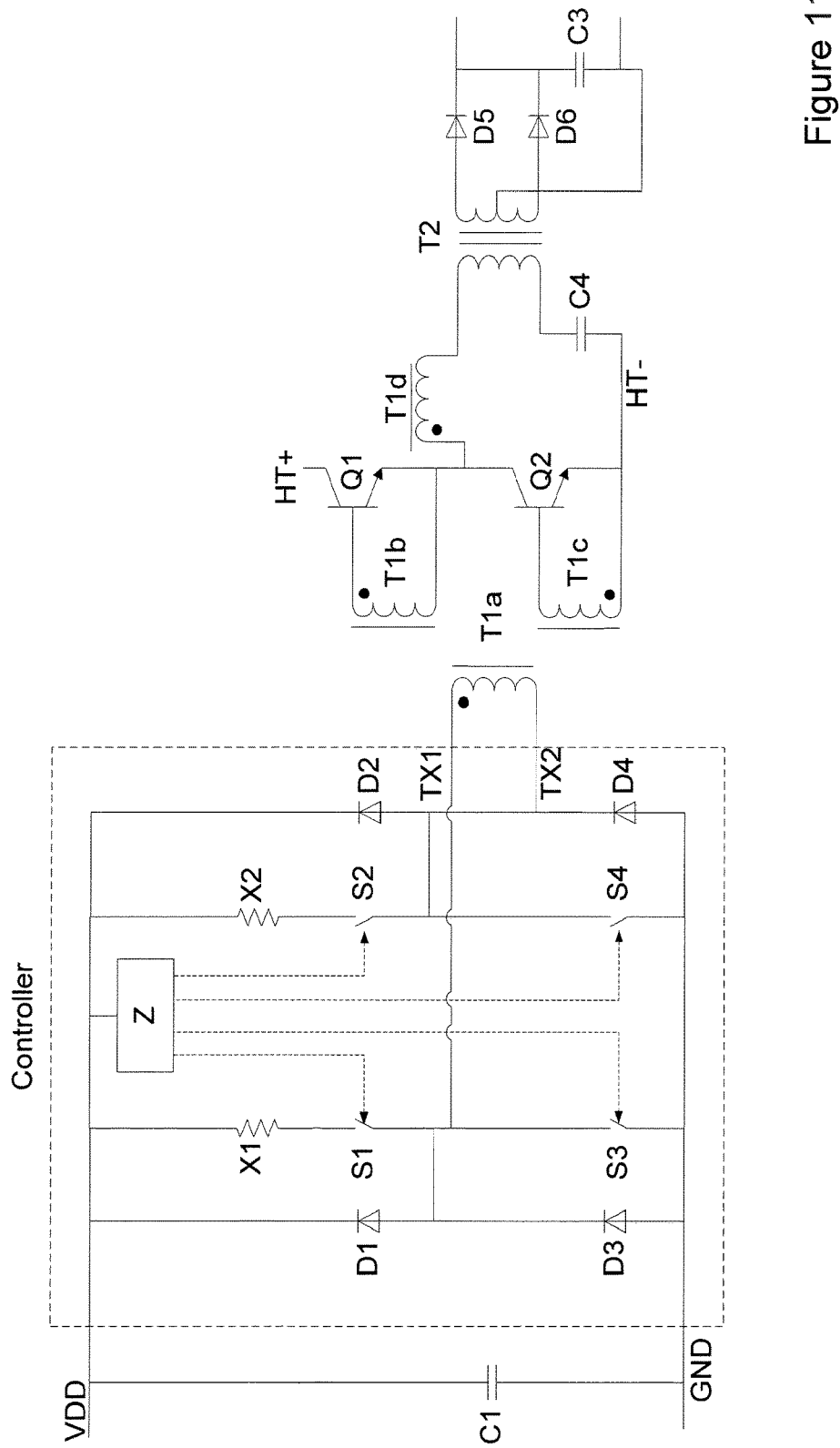
FIG. 11 is a schematic of a half-bridge CSOC similar to FIG. 3, with impedances X1, X2 interposed in series with switches S1, S2.

Referring to FIG. 11, the controller IC maintains control of the switching frequency by periodically clamping, i.e. closing a pair of switches, S3 and S4 to apply a clamp to the winding T1$a$, which is the control winding of the base drive transformer. By normal transformer action, this clamping has the effect of turning off whichever BJT is presently switched on (Q1 or Q2) and thereby terminating the present switching cycle. (Alternatively, pair S1 and S2 could be closed instead of S3 and S4.) When the controller removes the clamping, it may open one switch (say switch S3) but leave the other switch closed (say S4), so that one end of the control winding T1$a$ of the base drive transformer is free to move in sympathy with the reflected voltage of the other windings. As a result, the "free" end (TX1 in the case of S4 remaining closed) rises to a voltage determined by the forward-biased base-emitter junction voltage of Q1, reflected through the base-drive transformer. When the reflected voltage at TX1 is sensed to be higher than the supply voltage VDD, the controller may then close switch S1, causing current to flow from the GND rail, through switch S4 (which remains closed) through the transformer winding TX1 and thence switch S1 to the supply rail VDD, where the charge is accumulated on local decoupling capacitor C1 so that the voltage VDD rises. When the VDD voltage has risen sufficiently to achieve a desired value ($V_{REG}$) the controller again opens S2. Of course, if VDD is already at $V_{REG}$, it is possible that S2 may not be closed at all on that cycle as the additional power is not required. With this pattern being alternated on opposite phases of the switching cycle by using alternate switches, the VDD supply rail is maintained very close to the desired voltage $V_{REG}$ by pulses of energy occurring at twice the switching frequency of the power converter.

There is a possibility that the action of diverting energy from the base drive transformer can result in inadequate base drive for the BJTs, resulting in unpredictable switching behaviour. This may be avoided by interposing an impedance in series with each switch, shown as impedances X1, X2 in FIG. 11, which limit the current drawn from the transformer, leaving sufficient base drive current to turn on each BJT properly. This impedance could be a resistor, inductance, current source or the impedance of the switch itself, as would be obvious to a person skilled in the art.

Figure 12:
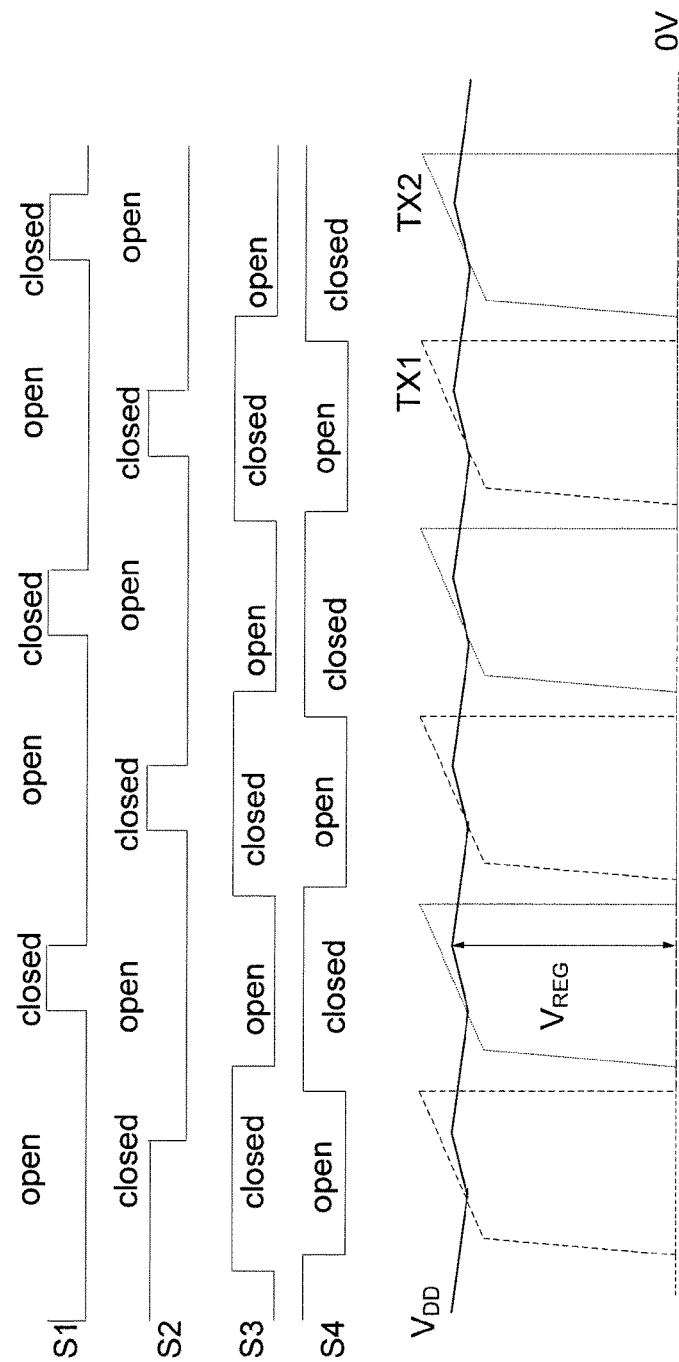
FIG. 12 is a graph of the switch waveforms, including the transformer control winding voltages TX1, TX2 and the housekeeping supply voltage VDD.

FIG. 12 illustrates a possible switching profile for switches S1 to S4, also showing the voltage on the supply rail VDD, the desired voltage $V_{REG}$ and the voltages sensed at TX1 and TX2 for the circuit of FIG. 11.

Figure 21:
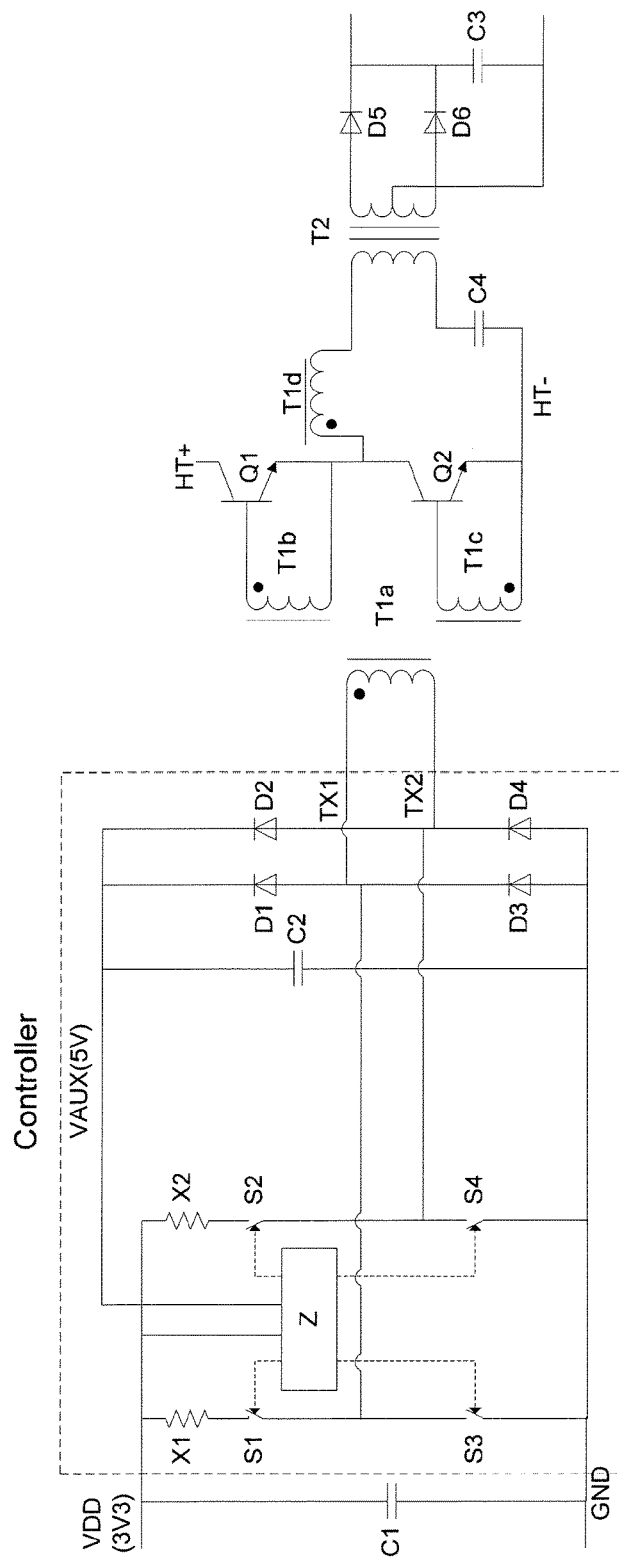
FIG. 21 is a schematic of a half-bridge SCOC similar to FIG. 12 with enhancements for more reliable startup.

A possible enhancement is shown in FIG. 21, in which there is an additional supply rail VAUX with additional decoupling capacitor C2. As indicated in the Figure, whilst VDD is preferably a 3.3 V supply, VAUX may be a 5 V supply or the like. In this implementation, static-protection diodes D1-D4 are coupled between VAUX, the control winding contacts and ground. The purpose here is to provide a means of achieving system startup in a reliable manner while drawing power for the control circuit from the control transformer winding.

Figure 2:
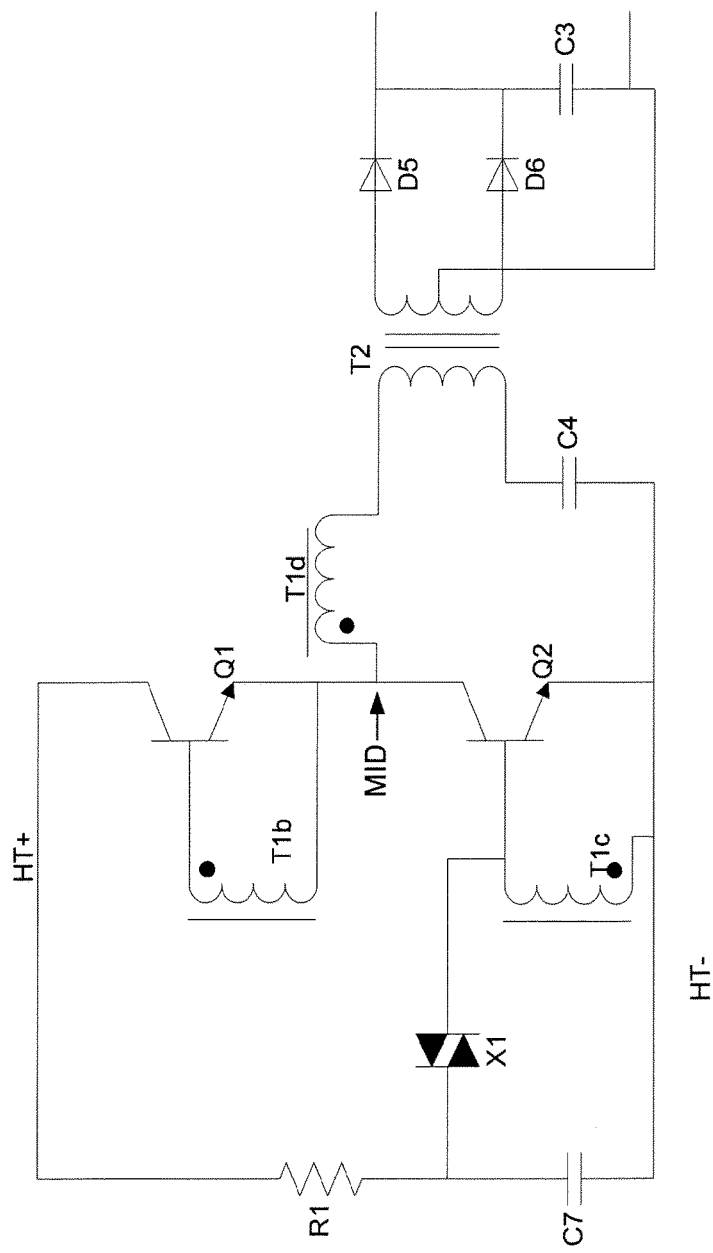
FIG. 2 is a schematic of a SOC with a diac starting circuit.
Figure 27:
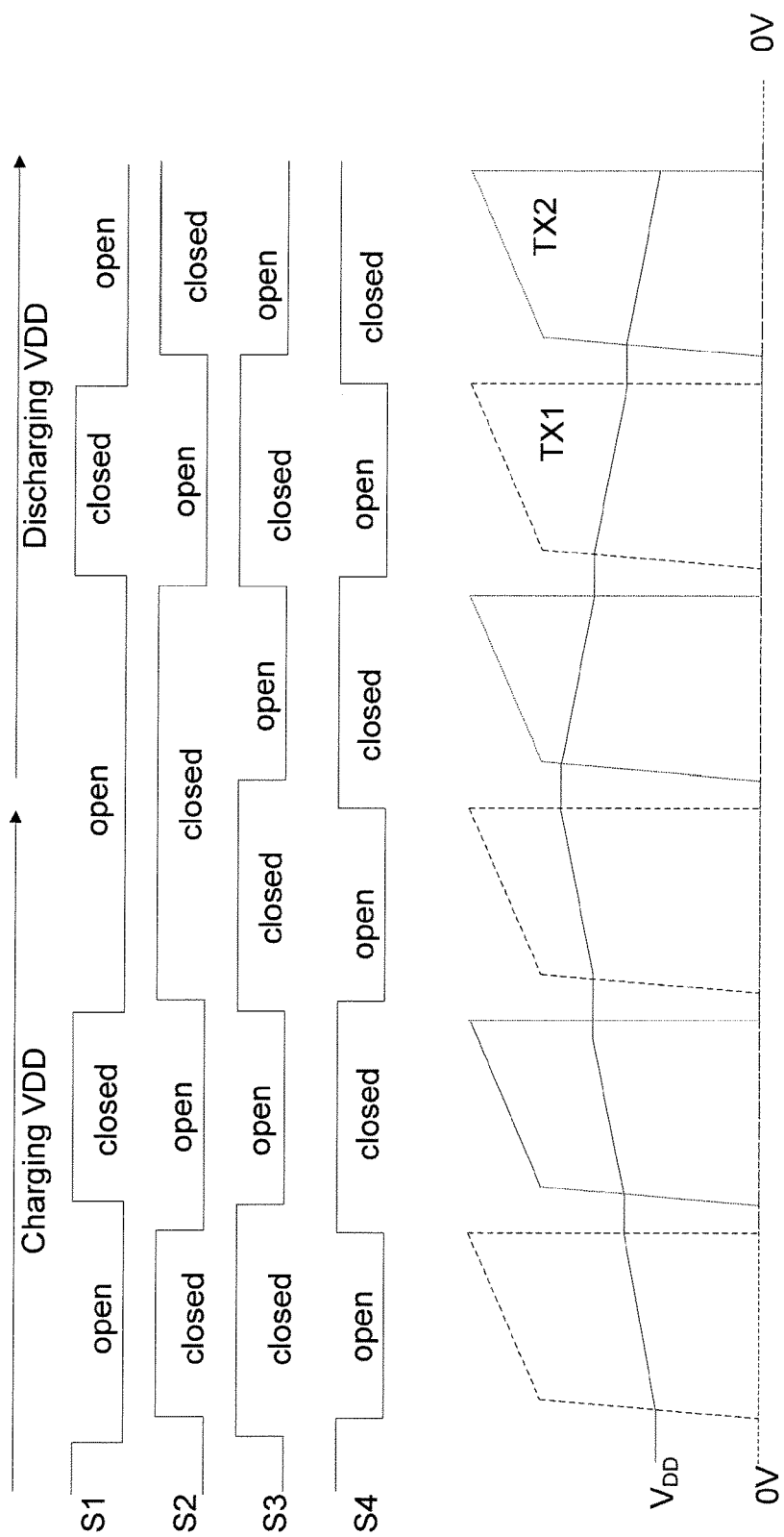
FIG. 27 is a graph of the switching waveforms for charging and discharging VDD.

In an initial state, when the power converter has not been operated for a long period of time, it may be assumed that the capacitors C1 and C2 are substantially discharged. Accordingly, the controller is not able to provide drive pulses in order to start oscillations in the power converter. It is assumed that some means is provided for initiating oscillation (such as the diac X1 shown in FIG. 2). This initiation is sufficient to turn on Q1, causing the reflected Q1 base-emitter voltage to forward-bias diode pairs D1, D4, thereby charging the auxiliary rail decoupling capacitor C2. Because the value of C2 is chosen to be small, a relatively small amount of energy is needed to raise the VAUX voltage from zero to a value sufficient to supply the controller U1, running in a low-power mode. From this point onwards, the controller U1 maintains a basic level of control as an oscillator, alternately closing switches S3, S4 at a maximum frequency, which ensures that the voltage generated at the output cannot exceed the target output voltage. At the same time, the controller U1 also alternately closes switches S1, S2, allowing the voltage across winding T1$a$ to charge the VDD rail via impedances X1, X2. Over many switching cycles, the voltage of the VDD rail eventually rises above the target voltage (3.3V in this case). At this point, the controller changes mode, because the VDD rail now has sufficient charge to sustain normal operation. As such, the controller may now be able to start to modulate the switching frequency and perform more advanced functions. With the VDD supply now a little higher than the target voltage, the controller changes the switch phasing of S1-S4 so that charge is removed from the VDD rail, causing the voltage of the VDD rail to fall. Exemplary waveforms are given in FIG. 27. The controller is thus able to regulate the voltage of the VDD rail by modifying the switch phasing, either by phase inversion (bang-bang fashion) or preferably by linear phase modulation.

Figure 13:
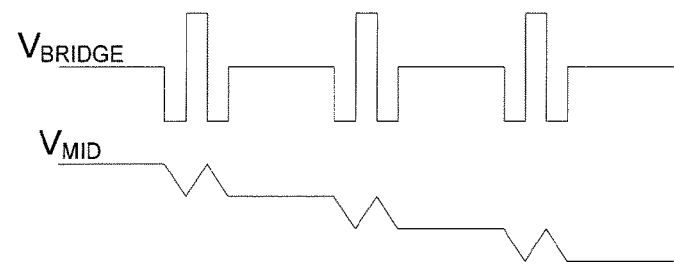
FIG. 13 is a representative graph of the voltage waveforms of the bridge and midpoint voltages for the CSOC of FIG. 3 when operating in burst mode with a first repeating pattern of pulses.
Figure 14:
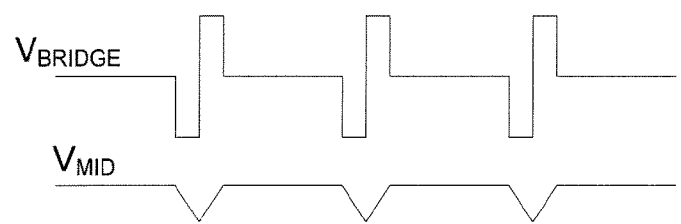
FIG. 14 is similar to FIG. 13, but shows behaviour with a second repeating pattern of pulses.

Referring to FIGS. 3 and 13, an example is given of the resonant half-bridge application operating in a burst mode, wherein each "burst" comprises an odd number of half-cycles (three half-cycles shown in FIG. 13). $V_{BRIDGE}$ and $V_{MID}$ represent the voltage across the bridge and the voltage at the mid point, MID, respectively. If each burst starts on the same phase as the previous burst, the underlying dc current delivered by the primary switches Q1 and Q2 is non-zero, resulting in the mid-point voltage $V_{MID}$ wandering away from the ideal value. Methods currently exist for suppressing this tendency, such as ensuring that each burst includes a comparatively large number of pulses. However, such methods generally require low frequency burst repetition rates, tending to produce audible noise from the transformer and associated components. FIG. 14 shows another method in which the controller issues power cycles in even numbers to maintain balance. However, this method requires that the power delivered by the first and second pulses is well-balanced, which is not well-suited to resonant converters with relatively slow switching devices such as BJTs.

Figure 15:
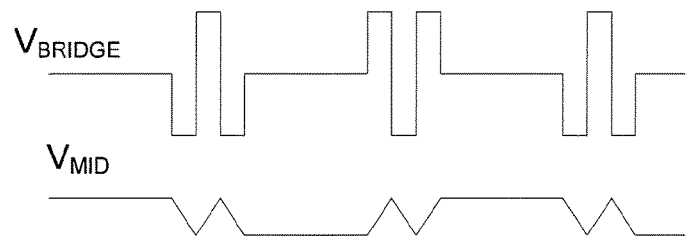
FIG. 15 is similar to FIG. 13 and FIG. 14, but shows behaviour with third repeating pattern of pulses.

Unstable operation at low load conditions can be avoided by a first burst strategy in which power cycles are issued within bursts which start on the opposite phase to the preceding burst, as shown in FIG. 15. In this way, power asymmetry due to the order of the issued pulses is eliminated.

Figure 16:
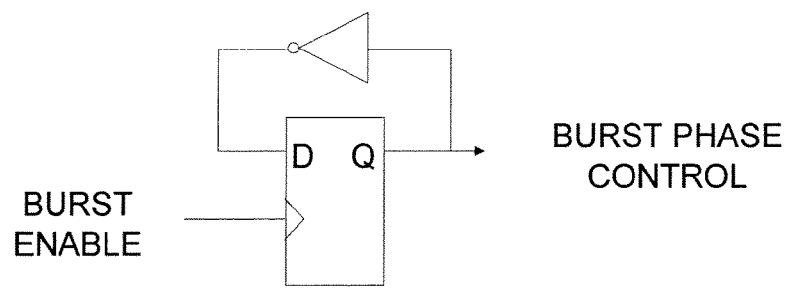
FIG. 16 is a partial schematic of a circuit which delivers power cycles within bursts which start on the opposite phase to the preceding burst.

One possible embodiment for enabling the controller to issue such alternating bursts uses a divide-by-2 flip-flop which determines the starting phase of the pulse bursts, as shown in FIG. 16. The clock input is driven by a BURST ENABLE signal, which clocks the flip-flop once at the start of every burst. The output of the flip flop BURST PHASE CONTROL is used to control the phase of the start of each burst, for example by controlling which of switches S1 and S2 are used to start the burst.

Figure 17:
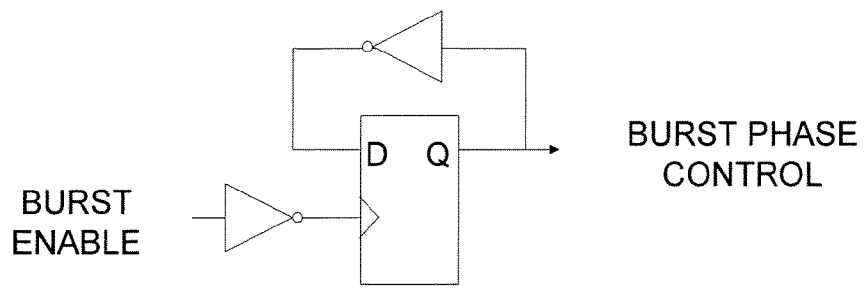
FIG. 17 is a partial schematic of a circuit which delivers power cycles within bursts which end on the opposite phase to the preceding burst.

Alternatively, unstable operation at low load conditions may be avoided by a second burst strategy in which power cycles are issued within bursts which end on the opposite phase to the preceding burst. In this case, a possible embodiment would be similar to that previously described except that the clock input is driven by the inverse of BURST ENABLE so that the flip-flop is clocked once at the end of each burst, as shown in FIG. 17. The output of the flip-flop BURST PHASE CONTROL is then used to control the phase of the end of each burst. In each case, the repetition rate and duration of each pulse burst can be determined by the characteristics of the overall control loop.

Alternatively again, unstable operation at low load conditions may be avoided by combining the first and second strategies to create a third strategy, in which power cycles are issued within bursts which start and end on the opposite phase to the preceding burst. This is particularly desirable as the amount of charge passed may be different for different pulses within the burst, and so each pulse is correspondingly cancelled out in the next burst.

A further strategy may be employed where the initial pulse of each burst is controlled to be opposite to the last pulse of the preceding burst. A similar arrangement to that of FIGS. 16 and 17 may be used. At the end of each burst, the pulse phase is determined and inverted and used to set the phase of the first pulse of the next burst. In this way, each burst effectively follows on from the previous burst with the next logical phased pulse.

In each policy described above, the repetition rate and duration of each pulse burst can be determined by the prevailing line and load conditions and the characteristics of the overall control loop. Conditions of lighter load or higher line voltage cause a greater proportion of time to be spent in the low power mode. The repetition rate of the bursts depends upon the characteristic response of the overall control loop, which is defined by the line and load conditions, but also by the overall loop gain and the number and position of the frequency poles and zeroes. For example, a system with a comparatively fast transient response will have a fast burst repetition rate.

In between each burst of drive pulses, the power converter preferably does not carry out any power conversion at all. As such, during the time between bursts, the power converter will be operating in the previously mentioned low power mode. When in low power mode, oscillation of the power converter may be suppressed by maintaining a short circuit across the control winding. As is later described, Burst mode may therefore be seen to be a natural consequence of the controller entering and periodically exiting the low power mode when under no load or low load conditions.

A method is described for accurately estimating the output current of a power converter with an AC-coupled primary, such as half-bridge, full bridge and cuk converters. Such a scheme is suitable for integration into the main system controller, and as such may be used to eliminate current sensing apparatus located on the secondary side of a power converter to save product cost and avoid the need for opto-isolators.

Figure 18:
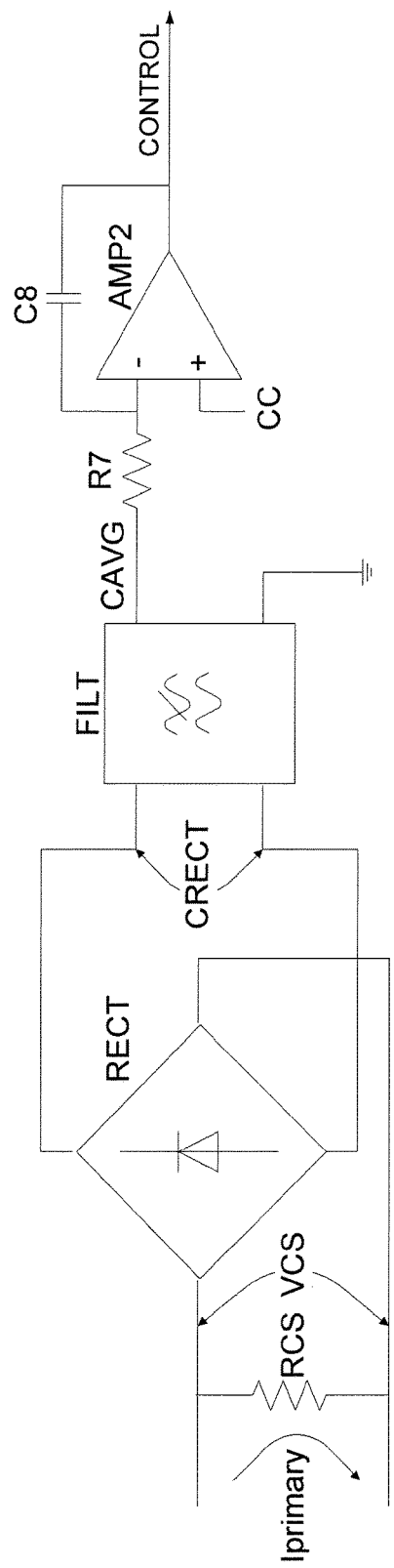
FIG. 18 is a schematic of a circuit used to derive the average primary current from the ac primary current waveform and use this parameter to control the power converter.
Figure 19:
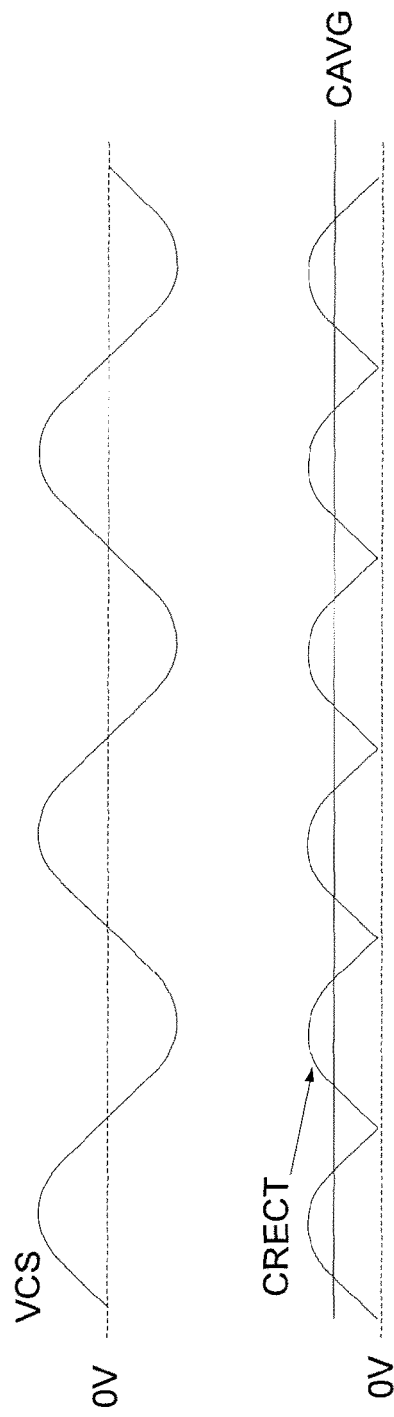
FIG. 19 is a graph of the key waveforms relating to FIG. 18.

The method senses the voltage appearing across a current sensing resistor RCS placed in series with the primary winding of the main transformer as described above, using full-wave rectification and filtering to derive a signal which accurately models the average rectified primary current. The average rectified primary current closely models the output current of the power converter, provided that the conversion efficiency is adequately high. Referring to FIGS. 18 and 19, the voltage VCS appears across the current-sensing resistor RCS and is full-wave rectified by the rectification block RECT to produce CRECT, which is then filtered by the low-pass filter block FILT to produce CAVG, a signal representing the average rectified primary current. The resistor R7, capacitor C8 and amplifier AMP2 form an integrator which integrates the error between CAVG and CC, a signal representing the desired constant current limit, to produce signal CONTROL.

Figure 20:
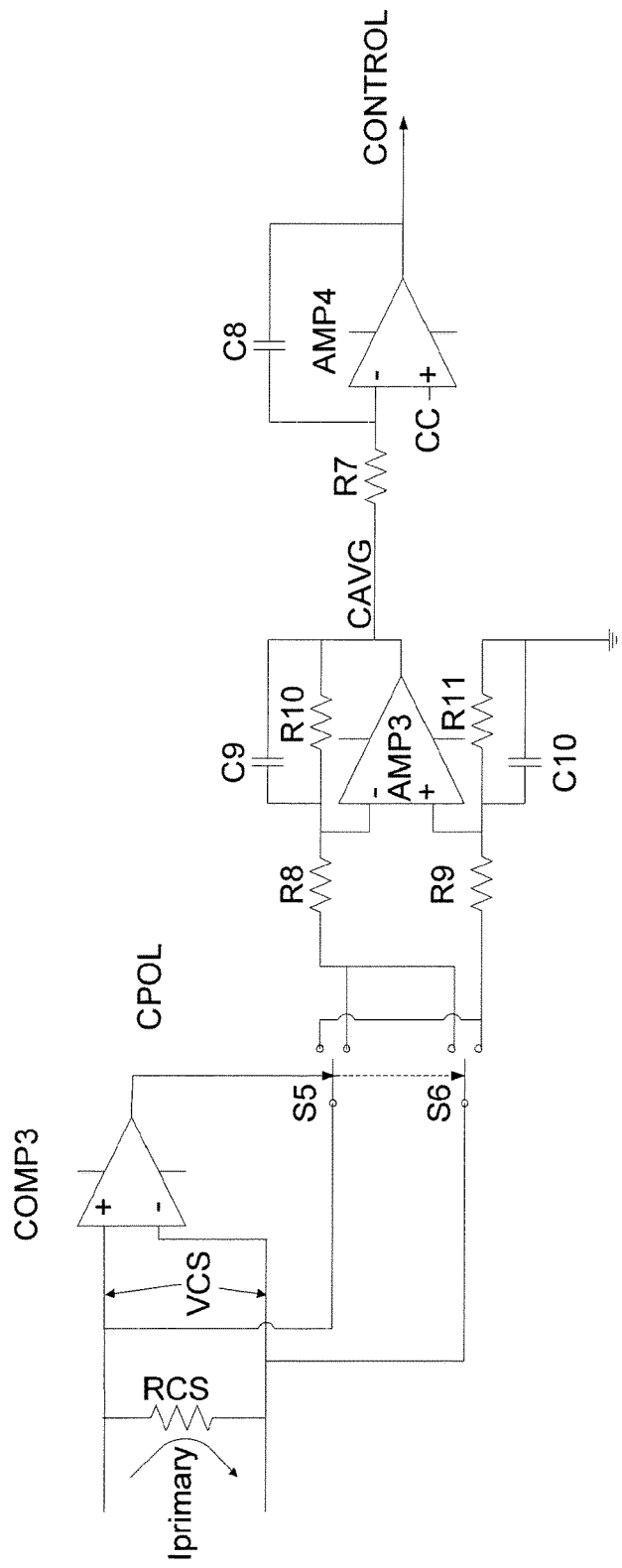
FIG. 20 is a partial schematic of a possible circuit to implement the block schematic given in FIG. 18.

A possible embodiment of the method is given in FIG. 20. A precision comparator COMP3 senses the zero-crossing points of the VCS waveform, producing CPOL, a signal which indicates the polarity of the VCS waveform. CPOL is used to control analog switches S5, S6 which present the rectified VCS voltage to the amplifier AMP3, which applies filtering and amplification, producing the signal CAVG, which is fed to the error amplifier AMP4 and associated components. The output signal CONTROL of the error amplifier AMP4 is used to control the power metering system of the power converter, which may use pulse-width modulation, pulse-frequency modulation or some other power metering scheme.

Although the embodiment depicted in FIG. 20 uses comparator COMP3 and switches S5 and S6 to achieve rectification, the skilled man will realise that other implementations may be used as a rectifier.

Two alternative methods are described for determining when the controller should enter the low-power mode, which both rely upon measuring an aspect of the primary winding current. A third method is also described for determining when the controller should exit the low-power mode.

Figure 22:
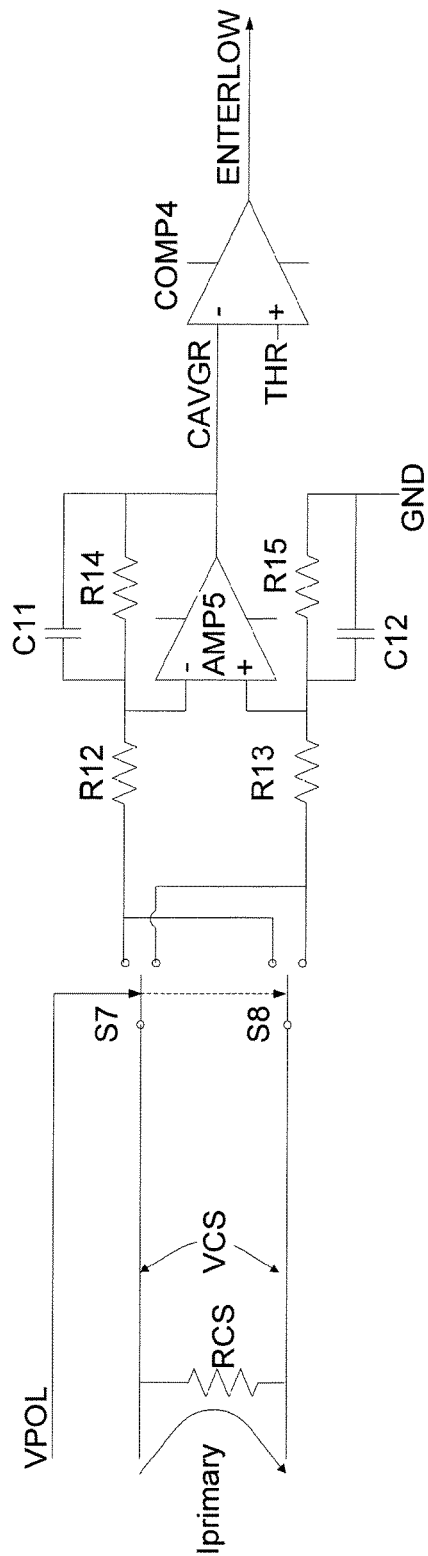
FIG. 22 is a partial schematic of a circuit which controls the entry to low-power burst mode, based on a comparison of the real portion of the average primary current against a fixed threshold.

In a first method, the input power to the primary winding current is measured and compared against a threshold to determine when to enter the low power mode. A simple analogue mixer is formed by a programmable inverter, controlled by a digital input whose level reflects the bridge switching voltage, as shown in FIG. 22. In order to estimate the real input power, it is necessary to perform the power integral:

$$P = \left(\frac{1}{T}\right) \int vi \, . .dt \text{ where}$$

T=switching period
v=bridge voltage
i=primary current
In this case, the bridge voltage is a function of time, so that
v=V when 0<t<T/2, and
v=−V when T/2<t<T Hence, the input power may be calculated from the equation $$P = \frac{V}{T}\left[\int_0^{T/2} i\,dt - \int_{T/2}^{T} i\,dt\right]$$

This may be expressed in terms of input voltage and average current:

$$P = V(\bar{I}_0^{T/2} - \bar{I}_{T/2}^{T}) \text{ where}$$

$\bar{I}_0^{T/2}$ is the average current over the period $0<t<T/2$
$\bar{I}_{T/2}^{T}$ is the average current over the period $T/2<t<T$ The partial schematic shown in FIG. 22 incorporates the function contained within the equation brackets. The signal VPOL may be generated as a delayed form of the main timing oscillator in the controller, or alternatively by the controller in response to the output of the turn-off sensing comparator which detects the end of the BJT active period, described earlier. VPOL provides the timing to control switches S7 and S8 so that the input averager AMP1 receives either the normal or inverted form of the bridge input. Note that this schematic is very similar to that shown in FIG. 20, with the difference in the timing of switches S7 and S8; VPOL is used, which is in phase with the voltage commutation, rather than the current commutation, represented by CPOL. In this manner, the schematic of FIG. 22 generates CAVGR, which represents the real component of the primary current.

CAVGR is then compared against a threshold THR to generate an output ENTERLOW, which is used by the controller to enter the low-power mode.

In a second method, alternative to the first method, the total primary current is averaged and compared against a reference which is a function of operating frequency. Taking a typical resonant converter with PFM control, similar to that shown in FIG. 3, the curves given in FIG. 25 show the average primary current and switching frequency across a range of supply voltages.

Figure 25:
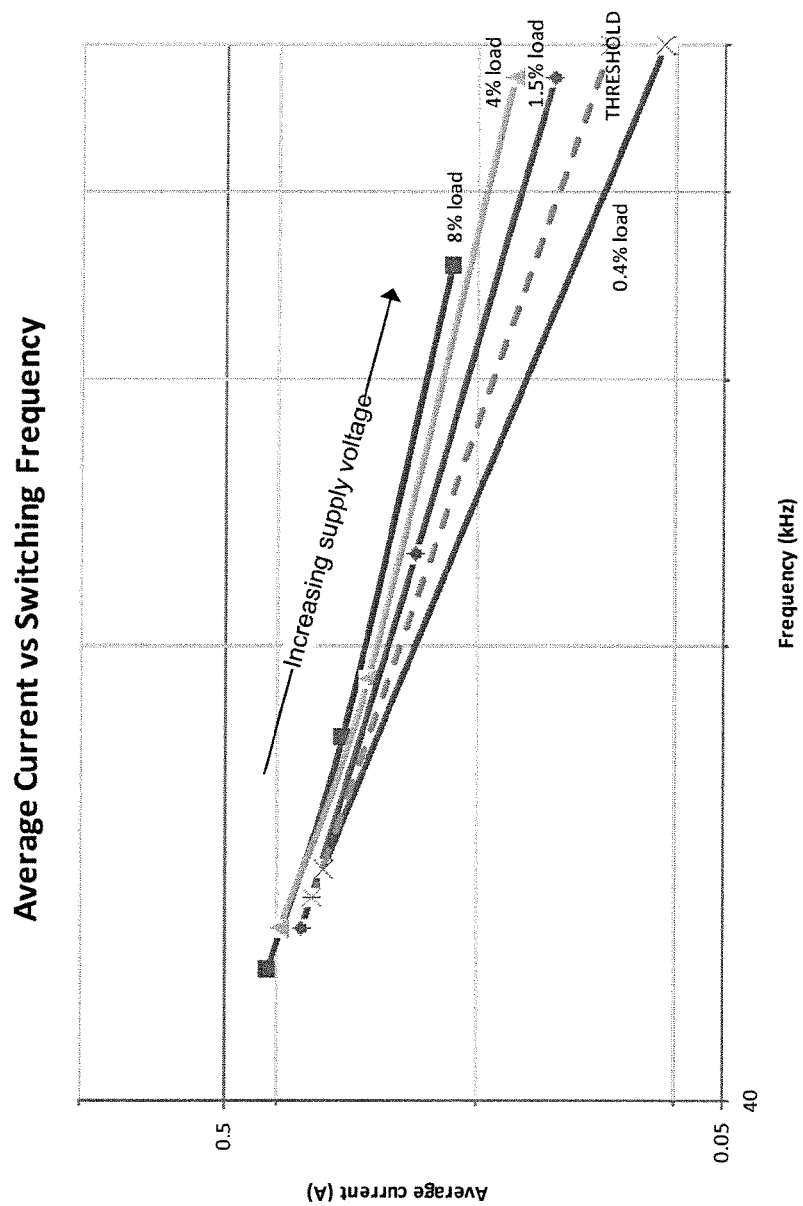
FIG. 25 is a graph of the average current as a function of switching frequency for a range of supply voltages.

A signal is constructed from the switching frequency to provide a threshold to which the average current may be compared, which is shown in FIG. 25 as the dashed line marked "THRESHOLD". By comparing the measured average current in the bridge against this threshold, it is possible to determine the appropriate point for the power converter to enter the low-power mode.

Figure 29:
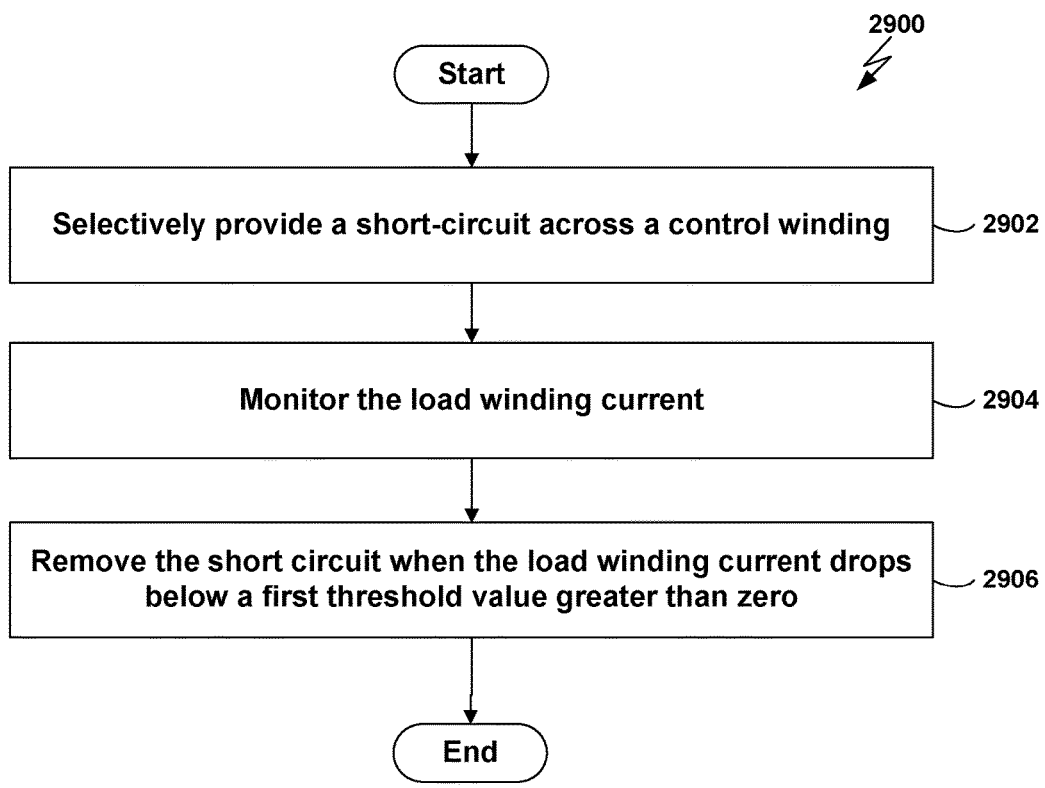
FIG. 29 is a flowchart which illustrates a method performed by certain embodiments of the present invention.

Referring to FIG. 29, a flowchart is shown which illustrates a method 2900 performed by certain embodiments of the present invention. As shown in FIG. 29, the method 2900 includes: selectively providing a short-circuit across a control winding (operation 2902); monitoring the load winding current (operation 2904); and removing the short-circuit when the load winding current drops below a first threshold value greater than zero (operation 2906).

Figure 23:
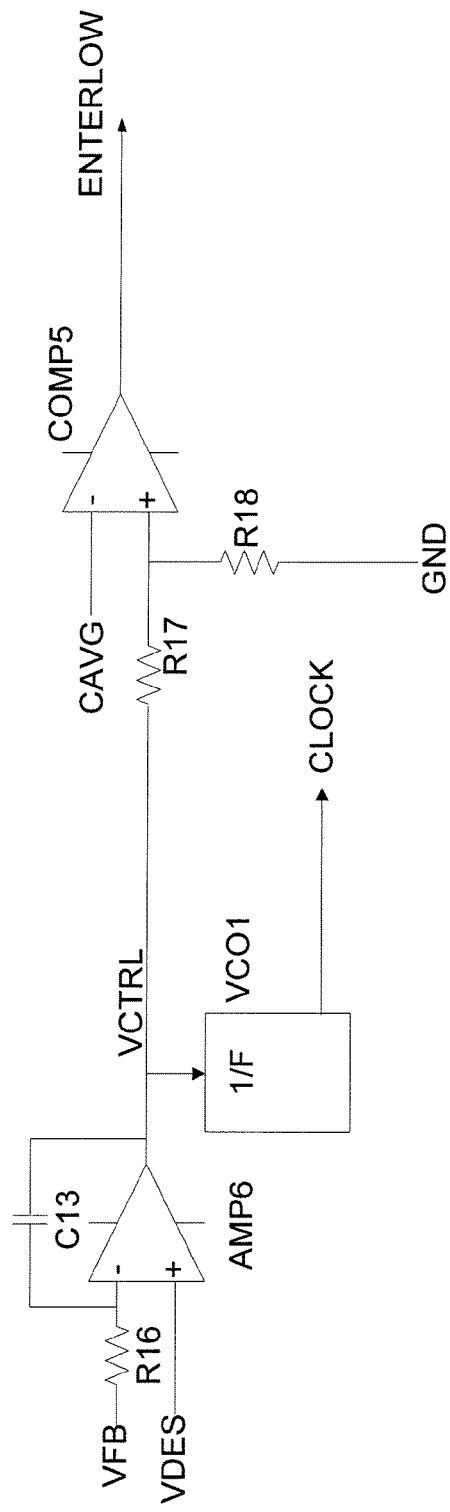
FIG. 23 is a partial schematic of a circuit which controls the entry to low-power burst mode, based on a comparison of the total average primary current against the main loop control voltage.
Figure 24:
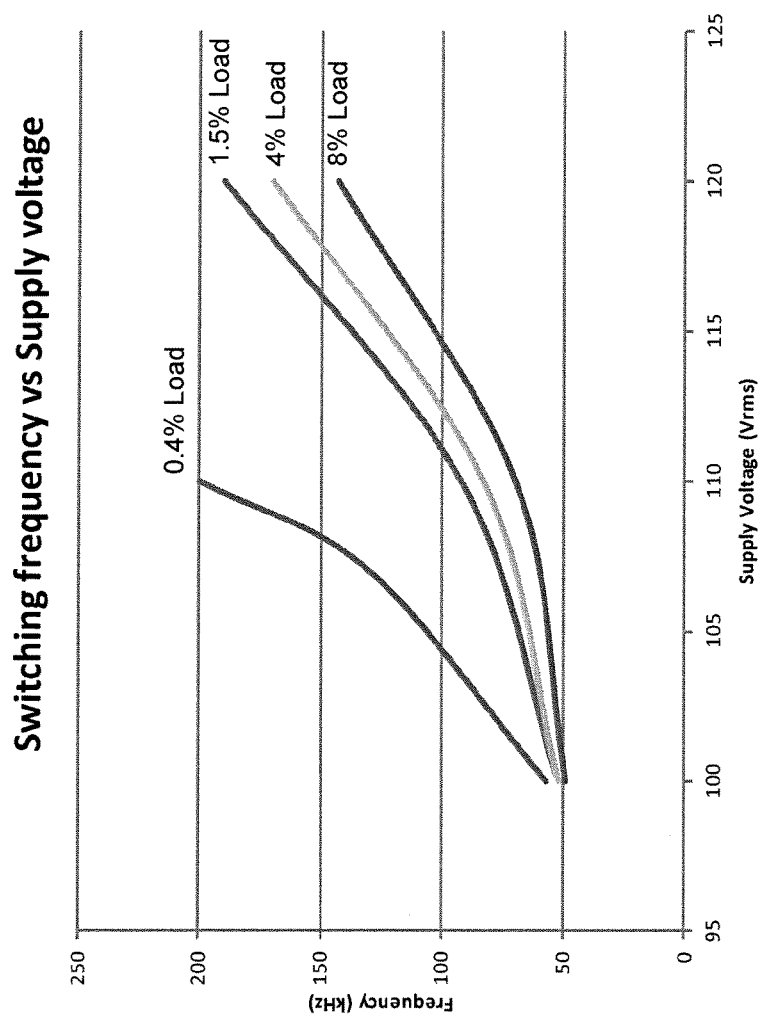
FIG. 24 is a graph of switching frequency as functions of supply voltage for various load conditions, taken from a typical resonant-mode half-bridge power converter.

A possible implementation is given in FIG. 23. The main control loop amplifier AMP6 generates a signal VCTRL, by integrating the difference between the sensed output voltage (VFB) and a desired reference voltage (VDES). VTRL controls a voltage controlled oscillator VCO1, producing clock signal CLOCK, which sets the switching frequency of the power converter. The voltage control oscillator is arranged so that the frequency of CLOCK is inversely proportional to the voltage VCTRL. Comparator COMP5 compares the average primary current represented by CAVG against VCTRL, scaled by resistors R17 and R18 to produce the signal ENTERLOW.

The two alternative methods (described above) are able to control the entry to the low-power mode. While the converter is in low-power mode, no power conversion takes place, so that any signals representing primary current are either zero or invalid. Hence, a third method is also required to control the exit from low-power mode which does not rely upon the sensed value of primary current.

This third method works by comparing the present value of the main control loop parameter VCTRL against a previously stored value of VCTRL. At the instant that the controller enters the low-power mode, the value of VCTRL is captured and used as a threshold for comparing the present value of VCTRL. (It is to be noted that the value of VCTRL is normally falling at the moment when the controller enters low-power burst mode). After entering the low-power burst mode, the output voltage of the converter is likely to droop, due to any residual output load, causing VCTRL to rise again. At the point when VCTRL rises above the previously captured value, the controller exits the low-power mode. In the case that there is no load or a low load applied, the controller may cause the power converter to carry out only a short burst of power conversion, after which the converter will enter the low-power mode again. Accordingly, the burst mode described above can be viewed as the natural result of the control methods described above. In the case that a load has been applied to the power converter, the controller can simply not enter the low-power mode again and continue allowing or driving the converter to oscillate and supply power to the load.

Figure 26:
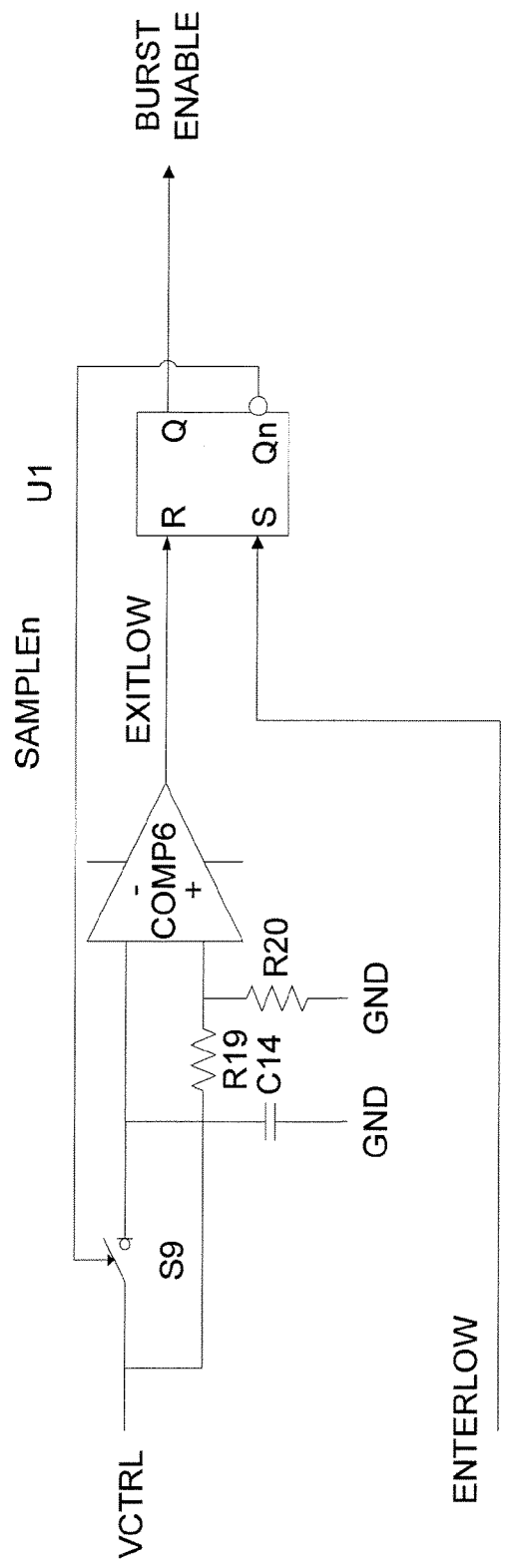
FIG. 26 is a partial schematic of a circuit which controls the exit from the low-power burst mode, based on a comparison of the present loop control voltage against a previously sample of the loop control voltage.

A partial schematic showing a possible implementation of this scheme is given in FIG. 26. When the input signal ENTERLOW (from one of the two schemes described above) goes high, the RS flip-flop U1 is set, driving SAMPLEn low and opening switch S9, so that the voltage of VCTRL is stored on capacitor C14. The comparator COMP6 compares the present value of VCTRL against the previously stored value. (Resistors R19, R20 provide some noise immunity, with values chosen so that with R20>>R19.) When the present voltage of VCTRL rises above the voltage stored on C14, the comparator COMP16 drives the output EXITLOW high, resetting the flip-flop U1 and forcing BURST ENABLE low, thus exiting the low-power mode. As described above, the low-power mode may be exited for only a short burst of drive pulses, hence the converter can be considered to be operating in a burst mode, or alternatively the low-power mode may be exited over a longer period of time when a load has been imposed on the power converter.

In the arrangement of FIG. 10, resistor RCS is used to provide a voltage indicative of the current in the primary circuit. This voltage may be provided to the controller, for example, through a dedicated pin on a chip carrying the controller. The availability of this voltage signal provides an alternative way to determine the current in the load winding rather than monitoring the current in the control winding. By using this voltage signal instead of the voltage across the control winding, the controller can determine the appropriate time to remove the short circuit across the control winding. Similarly, it may also be used to determine when to apply the short circuit. In this way, an alternative method is available for monitoring the load current and this may be used instead of or even in conjunction with the voltage measured on the control winding, as described above.

In this specification there are references to diodes. It will be appreciated by the skilled man, that diodes or the function of a diode may be implemented in a number of ways. A typical diode construction comprises a simple PN junction but diodes or diode function may be provided in other ways using more complex structures, for example a Field Effect Transistor may be configured to operate as a diode. It will therefore be understood that reference to diode in this specification is not intended to be limited to a simple PN junction but rather to any element or component which provides the unidirectional function of a diode.

In general, the various methods and embodiments described above may be used in any combination with each other in a power converter control chip for coupling to a control winding. As described, the control chip may be a controller having four switches controlled by a switch controller within the control chip, labelled Z in the figures.

The invention claimed is:

1. A method of controlling a resonant power converter having a transformer, the transformer having a primary input winding and a secondary output winding, the method comprising:
   measuring the average full wave rectified alternating current through a resistor coupled in series with the primary input winding, using an active rectifier to full-wave rectify the voltage across the resistor;
   comparing the measured average full wave rectified current to a reference level; and
   controlling the switching frequency of the resonant power converter based on the difference between the average current and the reference level.

2. The method according to claim 1, wherein said measuring step includes:
   averaging said rectified voltage with a filter.

3. The method according to claim 1, wherein:
   the comparing step includes integrating the difference between the average alternating current and the reference level; and
   the difference based on which the resonant power converter is controlled is the integrated difference between the average current and said reference level.

4. The method according to claim 2, wherein:
   the comparing step includes integrating the difference between the average alternating current and the reference level; and
   the difference based on which the resonant power converter is controlled is the integrated difference between the average current and said reference level.

5. The controller for a resonant switched power converter having a transformer and a switch, the transformer having a primary input winding and a secondary output winding, comprising:
   first and second current sensing resistor connections for connection to a current sensing resistor coupled in series with the primary input winding;
   a measurer including an active rectifier coupled to the first and second current sensing resistor connections and arranged to full-wave rectify the voltage across the current sensing resistor (RCS) connections, for determining the average full-wave rectified alternating current flowing through said current sensing resistor;
   a comparator for comparing the determined average full-wave rectified current to a reference level; wherein
   the controller controls the switching of the switch based on the output of the comparator for controlling the switching frequency of the resonant power converter.

6. The controller according to claim 5, wherein the measurer comprises:
   a low pass filter for filtering the rectified voltage.

* * * * *